(12) United States Patent
Wang

(10) Patent No.: US 12,356,624 B2
(45) Date of Patent: Jul. 8, 2025

(54) SEMICONDUCTOR DEVICE AND METHOD OF MANUFACTURING THE SAME

(71) Applicant: RENESAS ELECTRONICS CORPORATION, Tokyo (JP)

(72) Inventor: Yanzhe Wang, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 505 days.

(21) Appl. No.: 17/461,295

(22) Filed: Aug. 30, 2021

(65) Prior Publication Data

US 2023/0069105 A1 Mar. 2, 2023

(51) Int. Cl.
*H10B 43/35* (2023.01)
*H10B 43/10* (2023.01)

(52) U.S. Cl.
CPC ............ *H10B 43/35* (2023.02); *H10B 43/10* (2023.02)

(58) Field of Classification Search
CPC .................. H01L 29/51; H01L 29/518; H01L 29/4234–42352; H10B 43/35
See application file for complete search history.

(56) References Cited

U.S. PATENT DOCUMENTS

| | | |
|---|---|---|
| 9,257,446 B2 | 2/2016 | Arigane et al. |
| 2012/0146125 A1* | 6/2012 | Kim ........................ H10B 43/35 257/321 |
| 2012/0299084 A1* | 11/2012 | Saito ................. H01L 29/66833 257/E21.409 |
| 2013/0062684 A1* | 3/2013 | Ding ........................ C23C 16/40 438/586 |
| 2017/0077110 A1* | 3/2017 | Liu .................... H01L 29/66833 |

FOREIGN PATENT DOCUMENTS

JP 2015-103698 A 6/2015

* cited by examiner

*Primary Examiner* — Tucker J Wright
(74) *Attorney, Agent, or Firm* — Rimon P.C.

(57) ABSTRACT

Characteristics of a semiconductor device having a non-volatile memory are improved. The non-volatile memory has the following configuration: a semiconductor substrate; a first gate electrode portion arranged over the semiconductor substrate; a second gate electrode portion arranged over the semiconductor substrate so as to be adjacent to the first gate electrode portion; a first insulating film formed between the first gate electrode portion and the semiconductor substrate; a second insulating film formed between the second gate electrode portion and the semiconductor substrate and having a charge storage portion therein; and a first side wall insulating film arranged on a side surface side of the second gate electrode portion opposite to the first gate electrode portion, the charge storage portion being made of a high dielectric constant film containing hafnium and oxygen, and a gap being provided between the first side wall insulating film and the charge storage portion.

2 Claims, 27 Drawing Sheets

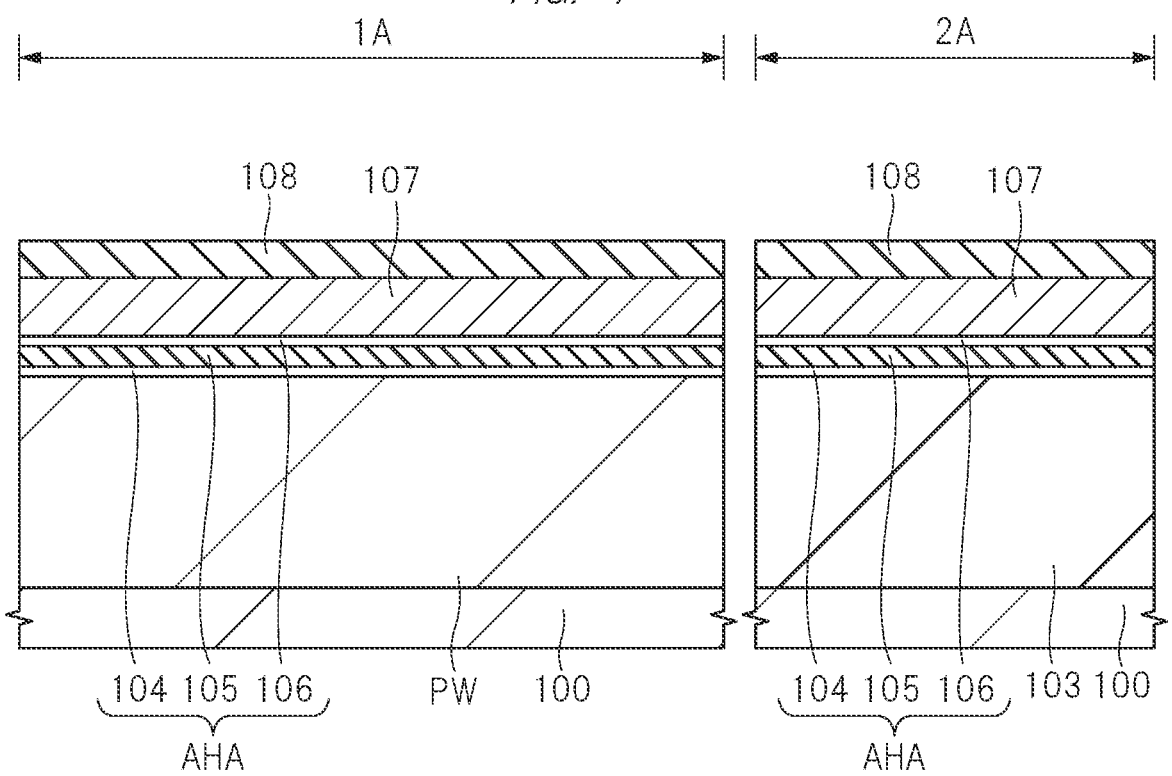

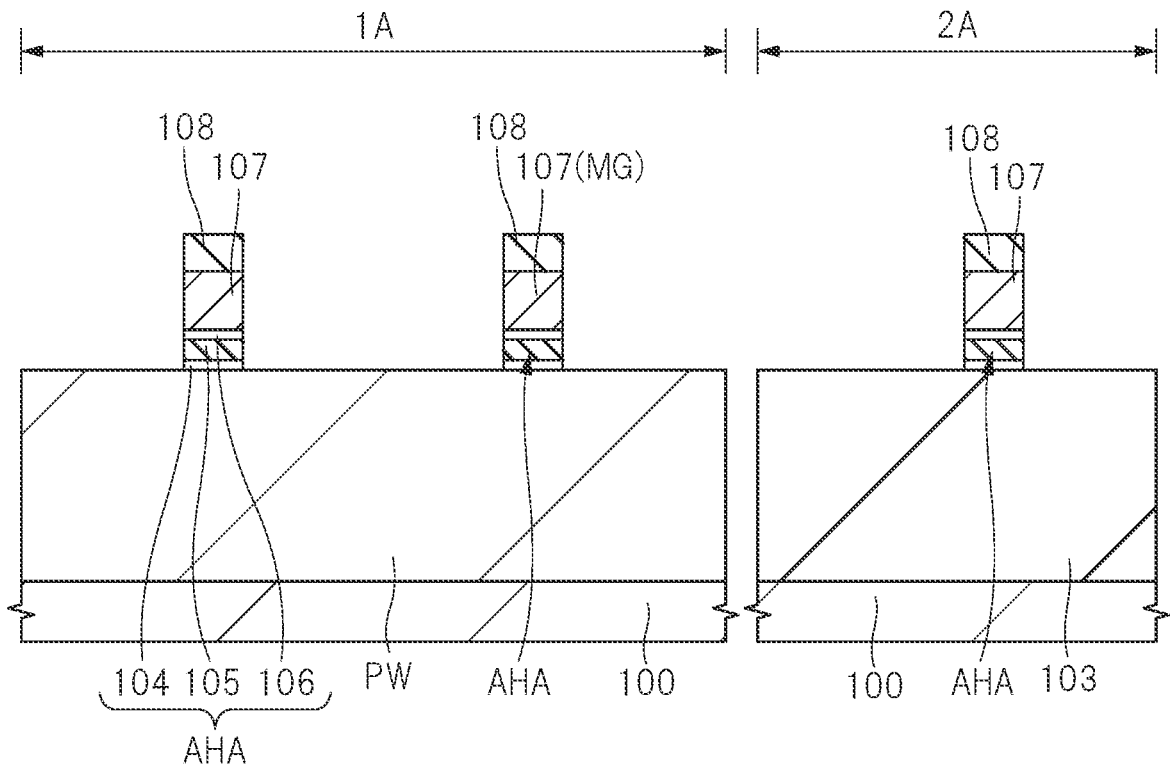
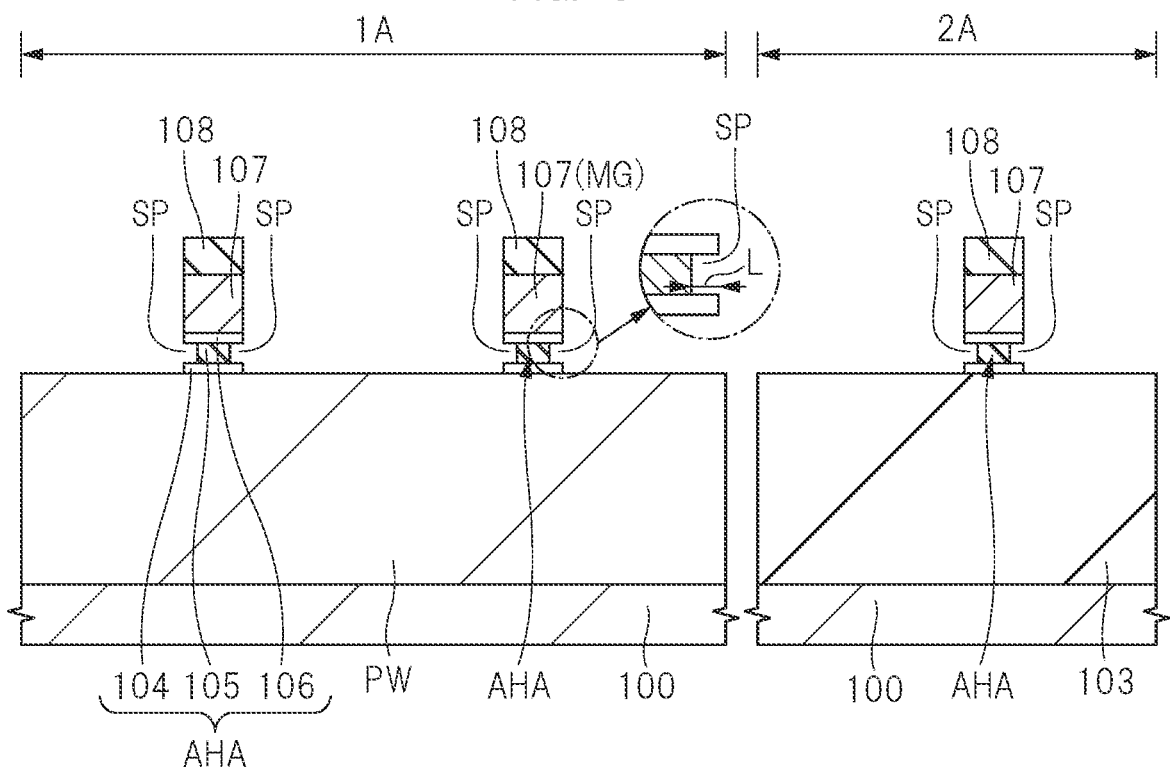

SEMICONDUCTOR DEVICE AND METHOD OF MANUFACTURING THE SAME

BACKGROUND

The present invention relates to a semiconductor device and a method of manufacturing the semiconductor device, and can be suitably used for, for example, a semiconductor device having a non-volatile memory cell and a method of manufacturing the same.

For example, as a non-volatile memory, there is a semiconductor device having a memory cell that is composed of a split gate type cell using a MONOS (Metal-Oxide-Nitride-Oxide-Semiconductor) film. This memory cell is formed by two MISFETs, that is, a control transistor having a control gate electrode and a memory transistor having a memory gate electrode. Then, a high-k material may be used for the transistor.

For example, Japanese Patent Application Laid-Open No. 2015-103698 discloses a semiconductor device that has: a non-volatile memory having a high-k insulating film (high dielectric constant film) as an insulating film of a memory transistor; and a transistor in a peripheral circuit region, a high-k/metal configuration being applied to the transistor.

SUMMARY

In a capacitor insulating film of a DRAM and a gate insulating film of a logic transistor, used is a so-called high-K material having a higher dielectric constant than those of an oxide film and a nitride film from demands for EOT (equivalent oxide film thickness) reduction and leak suppression due to miniaturization and lower voltages. Similarly, also in a non-volatile memory having a MONOS (Metal-Oxide-Nitride-Oxide-Semiconductor) film, there is a demand for miniaturization and lower voltages (including writing/erasing voltage), and it is considered to replace each constituent film of ONO with a high-k film so as to satisfy the EOT reduction and the leak suppression.

Incidentally, in the non-volatile memory, there is a relationship of "$\Delta Vth \propto \Delta Q \times EOT$" between an amount of change $\Delta Q$ in electric charges at a position away from the gate electrode and an amount of change $\Delta Vth$ in Vth of a memory transistor due thereto. From this relational expression, it can be seen that a simple reduction in the EOT results in a reduction in $\Delta Vth$. Therefore, in order to reduce the EOT with the Vth maintained, it is necessary to increase the $\Delta Q$, that is, to increase trap density of a trap film. An example of the high-k film that replaces ONO in order to satisfy such a requirement includes AHA (top layer $Al_2O_3$/trap layer HfSiO/bottom layer $Al_2O_3$) etc.

However, according to study of the present inventors, as will be described later, it has been found that contact between trap layer HfSiO and a spacer ($SiO_2$ film, SiN film) causes a decrease in memory characteristics (deterioration of drain current, deterioration of retention characteristics, writing/erasing speed of memory cells, and data rewriting (endurance) characteristics).

Therefore, it is desired to study a configuration of a semiconductor device capable of obtaining effects (EOT reduction and leak suppression) due to the high-k film while avoiding such deterioration of the memory characteristics.

The other objects and novel characteristics of the present invention will be apparent from the description of the present specification and the accompanying drawings.

The following is a brief description of an outline of the typical invention disclosed in the present application.

A semiconductor device shown in an embodiment disclosed in the present application includes: a first gate electrode portion; a second gate electrode portion arranged so as to be adjacent to the first gate electrode portion; a first insulating film formed between the first gate electrode portion and the semiconductor substrate; and a second insulating film formed between the second gate electrode portion and the semiconductor substrate and having a charge storage portion therein. Then, it has a second insulating film which is a side surface of the second gate electrode portion and is arranged on a side surface side opposite to the first gate electrode portion, the charge storage portion being made of a high dielectric constant film containing hafnium and oxygen, and it has a gap between the first side wall insulating film and the charge storage portion.

A method of manufacturing a semiconductor device shown in an embodiment disclosed in the present application includes: (a) forming a first conductive film in a first region of a semiconductor substrate via a first insulating film having a charge storage portion therein; and (b) side-etching the charge storage portion below the first conductive film. Then, in the step (b), a side surface of the charge storage portion is exposed in the first insulating film inside the first insulating film and on an element separation region, and the charge storage portion is side-etched in the first insulating film on an active region while the side surface of the charge storage portion is covered with the first side wall insulating film, and after the (b), gap is formed between the first side wall insulating film and the charge storage portion.

A method of manufacturing a semiconductor device shown in an embodiment disclosed in the present application includes: (a) forming a first conductive film in a first region of a semiconductor substrate via a first insulating film having a charge storage portion therein; and (b) forming a first side wall insulating film on side surfaces of the first conductive film and the charge storage portion. Then, it has: (c) forming a second side wall film on a side surface of the first side wall film; and (d) forming a gap between the first conductive film and the side surface of the charge storage portion by removing the first side wall film.

BRIEF DESCRIPTION OF THE DRAWINGS

FIG. 7 is a cross-sectional view showing a manufacturing process of the semiconductor device according to the first embodiment.

FIG. 8 is a cross-sectional view showing a manufacturing process of the semiconductor device according to the first embodiment.

FIG. 9 is a cross-sectional view showing a manufacturing process of the semiconductor device according to the first embodiment.

DETAILED DESCRIPTION

Figure 1:
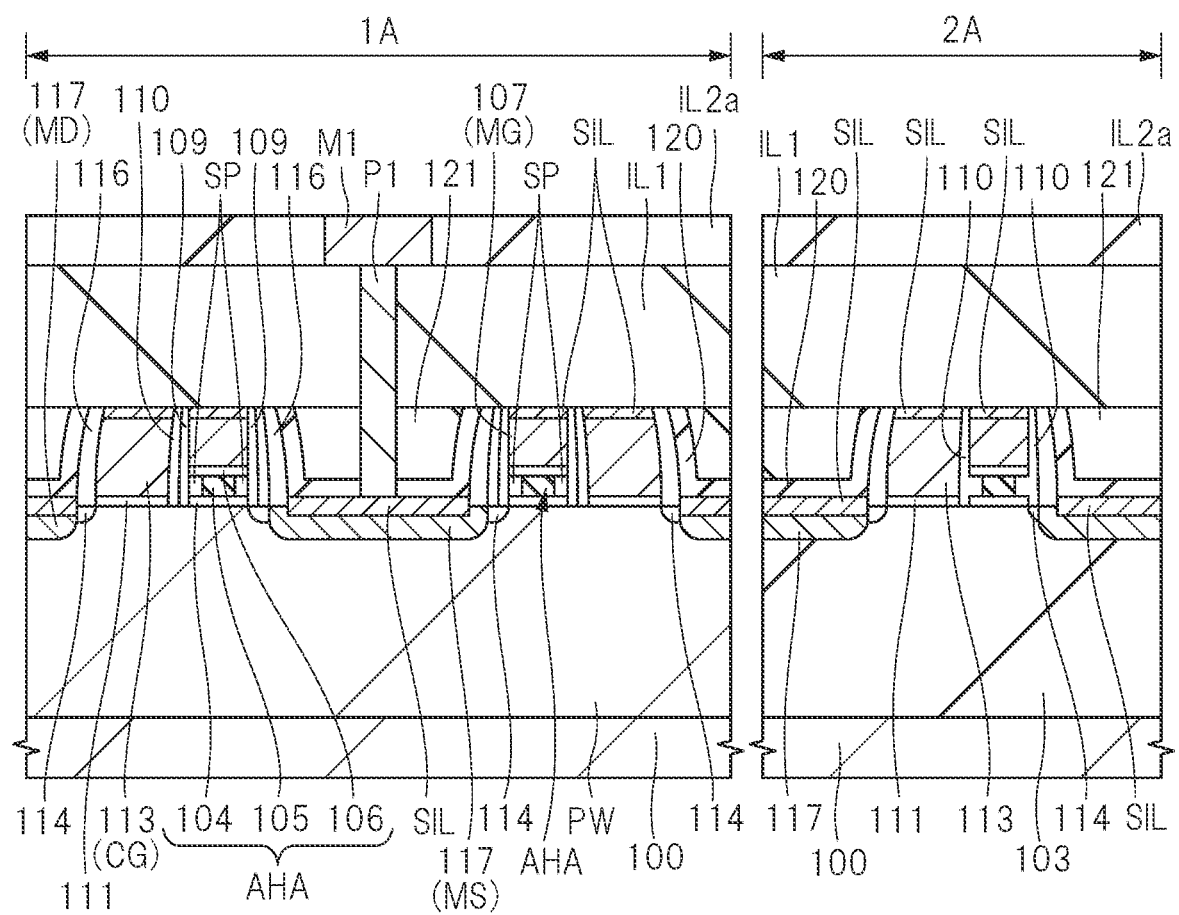
FIG. 1 is a cross-sectional view showing a semiconductor device according to a first embodiment.

Hereinafter, embodiments of the present invention will be described in detail with reference to the accompanying drawings. Note that components having the same function are denoted by the same reference characters throughout the drawings for describing the embodiments, and a repetitive description thereof will be omitted. In addition, the description of the same or similar portions is not repeated in principle unless particularly required in the following embodiments.

Also, in some drawings used in the following embodiments, hatching is omitted even in a cross-sectional view so as to make the drawings easy to see. In addition, hatching is used even in a plan view so as to make the drawings easy to see. In addition, hatching is used even in a plan view so as to make the drawings easy to see.

Further, the size of respective portions does not correspond to that of an actual device in cross-sectional views and in plan views, and a specific portion is shown in a relatively enlarged manner in some cases so as to make the drawings easy to see. Specific portions may be displayed by relatively enlarged sizes in order to make the drawings easy to understand even when the plan view and the cross-sectional view correspond to each other.

First Embodiment

Hereinafter, a structure of a semiconductor device according to the present embodiment will be described with reference to the drawings.

[Structural Explanation]

FIG. 1 is a cross-sectional view showing a semiconductor device according to the present embodiment.

Figure 2:
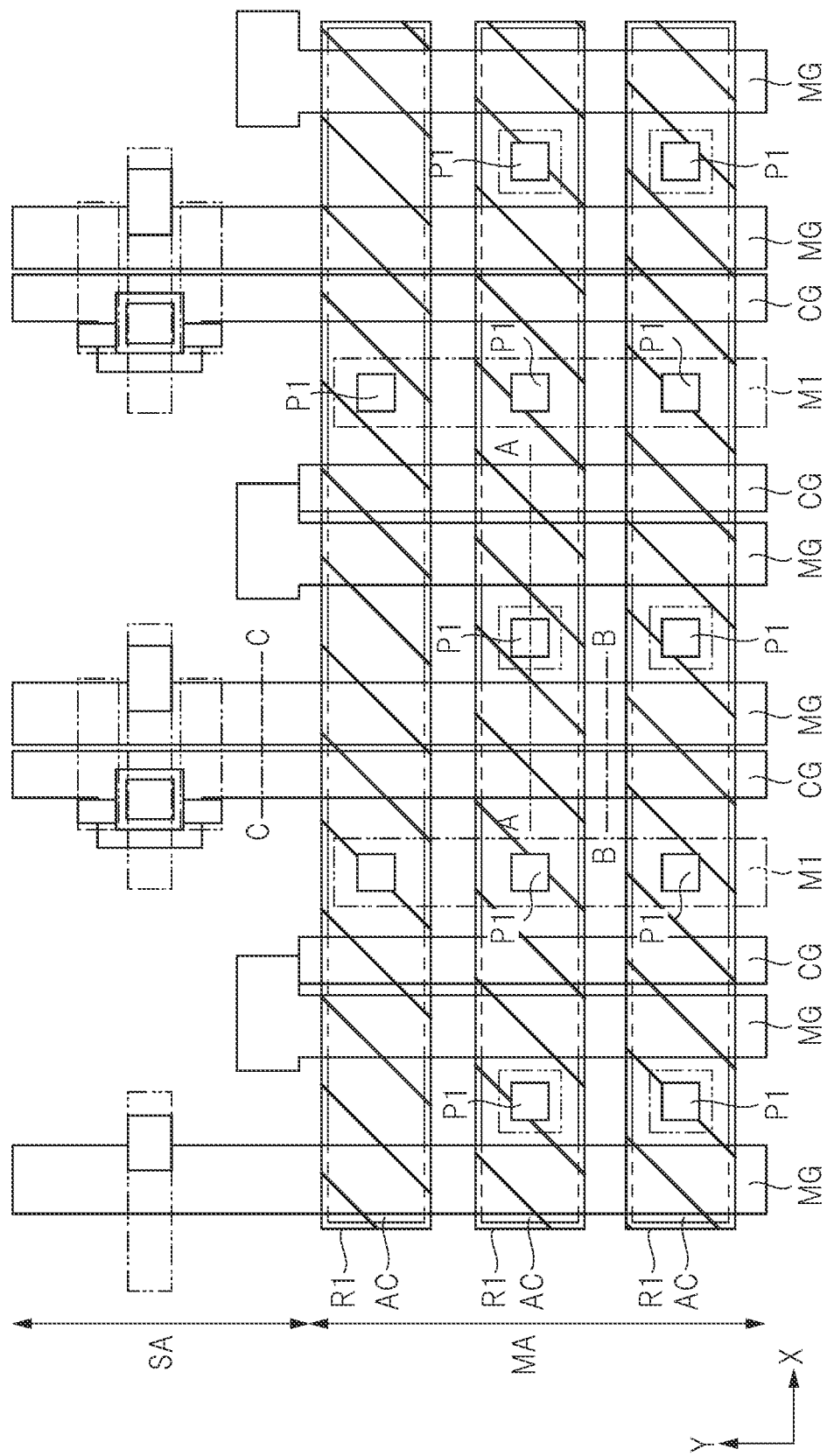
FIG. 2 is a plan view showing a memory array of the semiconductor device according to the first embodiment.

FIG. 2 is a plan view showing a memory array of the semiconductor device according to the present embodiment.

For example, a left view (region 1A) of FIG. 1 corresponds to an A-A cross section of FIG. 2, and a right view (region 2A) of FIG. 1 corresponds to a B-B cross section of FIG. 2.

Figure 3:
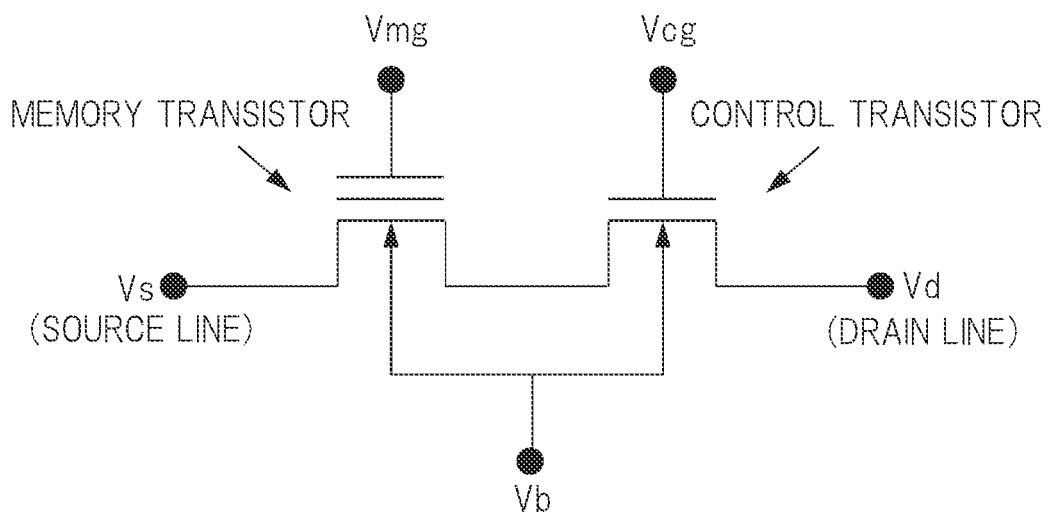
FIG. 3 is a circuit diagram showing a memory cell of the semiconductor device according to the first embodiment.

FIG. 3 is a circuit diagram showing a memory cell of the semiconductor device according to the present embodiment.

Figure 4:
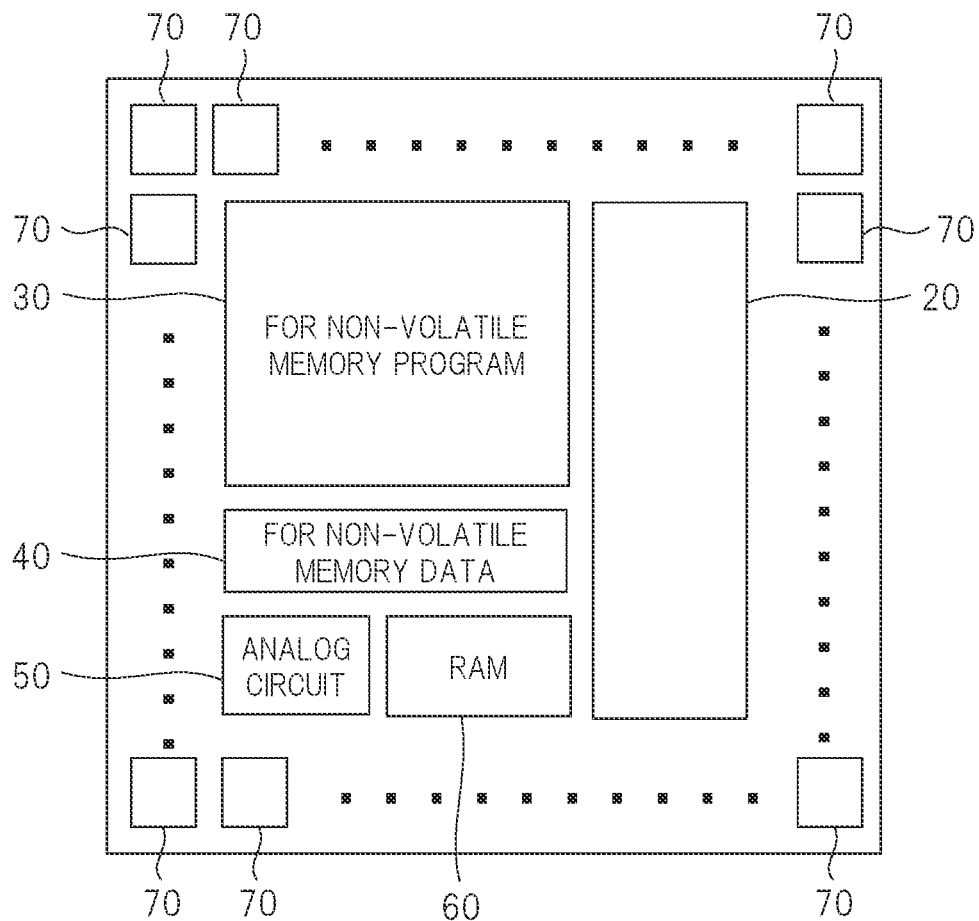
FIG. 4 is a block diagram showing a layout example of a semiconductor chip according to the first embodiment.

FIG. 4 is a block diagram showing a layout example of a semiconductor chip according to the present embodiment.

As shown in FIG. 1, a memory cell (element) includes a control transistor having a control gate electrode portion CG, and a memory transistor having a memory gate electrode portion MG.

Specifically, the memory cell has a control gate electrode portion CG arranged over a semiconductor substrate 100 (p-type well PW, also simply referred to as a substrate), and a memory gate electrode portion MG that is arranged over the semiconductor substrate 100 (p-type well PW) and is adjacent to the control gate electrode portion CG. For example, the control gate electrode portion CG and the memory gate electrode portion MG are each made of a silicon film. Further, a metal silicide film SIL is formed on an upper part of the silicon film.

The memory cell further has an insulating film 111 arranged between the control gate electrode portion CG and the semiconductor substrate 100 (p-type well PW).

In addition, the memory cell further has an insulating film AHA (104, 105, 106) arranged between the memory gate electrode portion MG and the semiconductor substrate 100 (p-type well PW). The insulating film AHA is composed of, for example, an $Al_2O_3$ film (aluminum oxide film, alumina) 104, an HfSiO film (hafnium silicate film) 105 on the $Al_2O_3$ film, and an $Al_2O_3$ film 106 on the HfSiO film 105. The HfSiO film 105 is a so-called HK film (high dielectric constant film, high-k film, high-k insulating film) and serves as a charge storage portion (trap layer). The HK film is a high dielectric constant film having a higher dielectric constant than that of a silicon nitride film.

Sidewall films (side wall insulating films, sidewall spacers) 109 and 110 are formed on side surfaces of the memory gate electrode portion MG and the insulating film AHA. Incidentally, the double (thick) sidewall films 109 and 110 are formed on the side surfaces of the memory gate electrode portion MG and the insulating film AHA over the semiconductor substrate 100 (p-type well PW), whereas the sidewall film 110 is formed on the side surfaces of the memory gate electrode portion MG and the insulating film AHA over an element isolation region 103.

Moreover, the memory cell further has a source region MS and a drain region MD formed in the p-type well PW of the semiconductor substrate 100. In addition, a sidewall film (side wall insulating film, sidewall spacer) 116 made of an insulating film is formed on each side wall portion of a composite pattern of the memory gate electrode portion MG and the control gate electrode portion CG.

Here, a total film thickness of the sidewall film on a source region MS side is thicker than a total film thickness of the sidewall film on a drain region MD side, and such a configuration can improve a withstand voltage on the source region side to which a higher potential is applied.

The source region MS includes an $n^+$ type semiconductor region 117 and an $n^-$ type semiconductor region 114. The $n^-$ type semiconductor region 114 is formed in a self-aligned manner with respect to the side wall of the control gate electrode portion CG. Further, the $n^+$ type semiconductor region 117 is formed in a self-aligned manner with respect to a side surface of the sidewall film SW on a control gate electrode portion CG side, and is deeper in injection depth and higher in impurity concentration than those of the $n^-$ type semiconductor region 114. Such a source electrode (or drain electrode) composed of a low concentration semiconductor region and a high concentration semiconductor region is called an LDD (Lightly doped Drain) structure.

The drain region MD includes an $n^+$ type semiconductor region 117 and an $n^-$ type semiconductor region 114. The n-type semiconductor region 114 is formed in a self-aligned manner with respect to the sidewall film 109 on the side surface of the memory gate electrode portion MG. Further, the $n^+$ type semiconductor region 117 is formed in a self-aligned manner with respect to the side surface of the sidewall film 116 on the memory gate electrode portion MG side, and is deeper in injection depth and higher in impurity concentration than those of the $n^-$ type semiconductor region 114.

Figure 5:
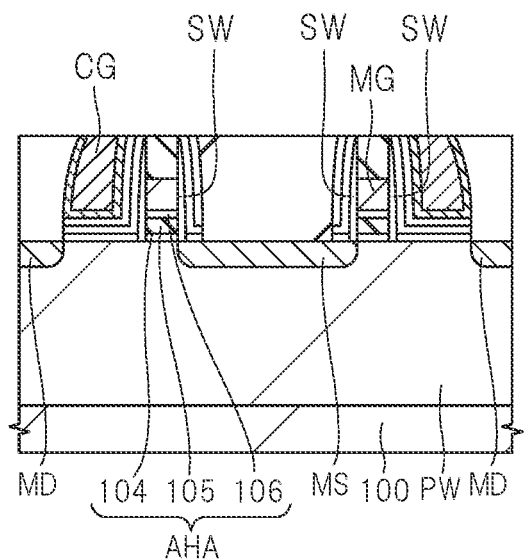
FIG. 5 is a cross-sectional view showing a semiconductor device of a studied example.

Here, in the semiconductor device of the present embodiment, a gap (space, air gap) SP is arranged between the HfSiO film 105, which is an HK film, and the sidewall film 109. This makes it possible to avoid a problem of a studied example described later and improve characteristics of the semiconductor device. FIG. 5 is a cross-sectional view showing a semiconductor device of a studied example.

Figure 6:
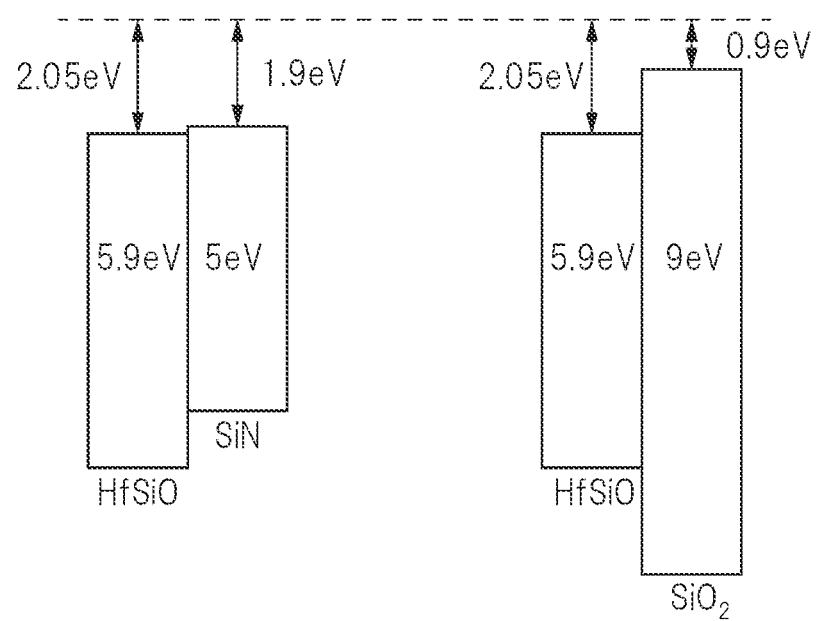
FIG. 6 is a diagram showing each band offset of a combination of HfSiO and $SiO_2$ and a combination of HfSiO and SiN.

For example, when the HK film (HfSiO film 105) which is a charge storage portion and the sidewall film SW made of a silicon oxide film are in contact with each other as in the studied example, oxygen intrudes into the HK film which is a charge storage portion and the HK film is altered. In addition, oxidation of the semiconductor substrate can be caused due to oxidation catalytic action of the HK film. An on-current decreases due to such alteration of the HK film and oxidation of the semiconductor substrate below the HK film. Further, when the sidewall film SW is a silicon nitride film, a problem of the oxygen intrusion can be avoided, but as shown in FIG. 6, a combination of HfSiO and SiN is smaller in band offset than a combination of HfSiO and $SiO_2$, and insulating properties of the sidewall film 109 decrease. That is, as compared with a case where the sidewall film 109 is a silicon oxide film, when the sidewall film 109 is a silicon nitride film, the electric charges of the charge storage portion more easily escape into the sidewall film 109. As a result, the retention characteristics of the memory cell deteriorate. Further, since the sidewall film 109 made of a silicon nitride film can function as a trap film, the writing/erasing speed and endurance characteristics of the memory cell can be lowered. FIG. 6 is a diagram showing each band offset of a combination of HfSiO and $SiO_2$ and a combination of HfSiO and SiN.

In this way, when the HK film and the sidewall film SW are in contact with each other, the characteristics of the semiconductor device may deteriorate. In contrast, according to the present embodiment, since the gap SP is provided between the HfSiO film 105, which is the HK film, and the sidewall film 116, the characteristics of the above-mentioned semiconductor device avoids deteriorating (decease in on-current, writing/erasing speed of memory cells, deterioration in endurance characteristics) and, simultaneously, the effect (EOT reduction and leak suppression) of the above-mentioned insulating film AHA (104, 105, 106) can be enjoyed.

Incidentally, in this specification, the source region MS and the drain region MD are defined based on operating time. A semiconductor region to which a high voltage is applied during a writing operation described later is referred to as a source region MS, and a semiconductor region to which a low voltage is applied during the writing operation is referred to as a drain region MD.

Further, a metal silicide film SIL is formed on each upper portion of the control gate electrode portion CG, the memory gate electrode portion MG, the source region MS (n-type semiconductor region 117), and the drain region MD (n-type semiconductor region 117) (FIG. 1).

Also, a silicon nitride film 120 and a silicon oxide film 121 are formed as an insulating film (embedded insulating film) between the memory cells and, further, a silicon oxide film IL1 and silicon film (insulating film for wiring trench) IL2a are formed as an interlayer insulating film on the silicon oxide film 121. A plug P1 is formed in the silicon oxide film IL1, and a wiring M1 is formed in the silicon oxide film IL2a.

Here, the two memory cells shown in FIG. 1 are arranged substantially symmetrically with the source region MS being sandwiched between the two cells. Incidentally, a plurality of memory cells are further arranged in the memory cell region MA (see FIG. 2). For example, a memory cell (not shown) sharing the drain region MD is arranged further to left of the memory cell on a left side of an area 1A shown in FIG. 1.

(Memory Array)

As shown in FIG. 2, the control gate electrode portion CG and the memory gate electrode portion MG of the memory cell extend in a Y direction (direction intersecting A-A cross section, vertical direction of paper surface). Incidentally, MA is a memory area and SA is a shunt area.

In the memory area MA, a plurality of active regions (p-type well PW) AC are provided in a line extending in an X direction. This active region AC is partitioned by the element isolation region 103 and is an exposed region of the p-type well PW.

The control gate electrode portion CG and the memory gate electrode portion MG are arranged symmetrically with respect to the wiring M1 that connects the plugs P1 arranged side by side in the Y direction. The wiring M1 is located between the control gate electrode portions CG and serves as a drain line. The plug P1 and the wiring M1 are provided between the memory gate electrode portions MG, and the wiring M1 is connected to the source line. Incidentally, a C-C cross section in the shunt area SA is the same as the B-B cross section (right view (region 2A) of FIG. 1).

Further, the memory cells (memory transistors, control transistors) shown in FIG. 3 are arranged in an array at the intersection of the drain line and the source line.

As shown in FIG. 4, an input/output I/O circuit 70 is arranged around the semiconductor chip. For example, a digital/analog conversion circuit or the like is arranged in the analog circuit 50, and an external analog signal is converted into a digital signal used by the CPU 20. The CPU 20 processes information as a microcontroller. A RAM 60 is, for example, an SRAM, and temporarily serves data to be processed by the CPU 20. The non-volatile memory has two blocks, one for programming and one for data. A program for information processing is stored in a programming block (30). Information desired to be memorized even after power of the semiconductor chip is turned off is stored in the data block (40). The memory array can be used as, for example, a non-volatile memory for programs (30) or data (40). A block for the non-volatile memory besides the memory cells is provided with: a logic circuit for writing/erasing/reading the memory cells; and a power generation circuit required for writing/erasing the non-volatile memory. Incidentally, applied voltages correspond to Vd, Vcg, Vmg, Vs, and Vb in the memory cell shown in FIG. 3 described above.

(Operation)

Next, an example of a basic operation of the memory cell will be described. Table 1 below shows an example of the applied voltages of the memory cell.

TABLE 1

| OPERATION | APPLIED VOLTAGE | | | | |
| --- | --- | --- | --- | --- | --- |
|  | Vd | Vcg | Vmg | Vs | Vb |
| WRITING | 0.3 V | 1 V | 6 V | 5 V | 0 V |
| ERASING | 0 V | 0 V | −5 V | 5 V | 0 V |
| READING | 1 V | 1 V | 0 V | 0 V | 0 V |

In writing, electrons are injected into the trap film of the MG on an erased state to cancel holes in the trap film, and are accumulated to increase the Vth of the MG transistor. Here, a Source Side Injection (SSI) method is adopted for the writing. The Vd is applied, and the electrons supplied from the source flow through a channel of the weakly inverted control transistor to a memory transistor side. The electrons become hot electrons due to a high voltage of Vs, are pulled by a high voltage Vmg of the memory gate electrode portion MG to be injected into the trap film of the memory transistor.

In erasing, holes are injected into the trap film of the memory transistor on a writing state to cancel electrons in the trap film, and are accumulated to lower the Vth of the memory transistor. Here, a Band To Band Tunneling (BTBT) method is adopted for the writing. A depletion layer between the source to which the high voltage Vs is applied and the substrate becomes narrower under the memory gate electrode portion MG to which the high negative voltage Vmg is applied, and electrons in a valence band on the substrate side are tunneled to a conduction band on the source side. Thus, the holes generated on the substrate side are pulled by the memory gate electrode portion MG to which the high negative voltage Vmg is applied, and are injected into the trap film.

In the reading, the control transistor is turned on. A sense amplifier lying ahead of a bit line (drain line) to which the drain is connected determines a difference between an amount of currents flowing when the Vth of the memory transistor is high (writing state) and an amount of currents flowing when the Vth of the memory transistor is low (erasing state), thereby discriminating two states (corresponding to a binary value of 1 bit).

Incidentally, the configuration and the above operation shown in FIG. 2 are examples, and the configuration and operation of the semiconductor device of the present embodiment are not limited to these.

[Explanation of Manufacturing Method]

Next, a method of manufacturing the semiconductor device according to the present embodiment will be described with reference to FIGS. 7 to 26. FIGS. 7 to 26 (excluding FIG. 14) are cross-sectional views each showing a manufacturing process of the semiconductor device according to the present embodiment. FIG. 14 is a plan view.

First, as shown in FIG. 7, an element isolation region 103 is formed on a main surface of a semiconductor substrate 100. As the semiconductor substrate 100, for example, a semiconductor substrate made of p-type single crystal silicon is prepared. An element isolation trench is formed by etching the semiconductor substrate 100. Next, a silicon oxide film is deposited on the semiconductor substrate 100 including an inside of the element isolation trench by using a CVD (Chemical Vapor Deposition) method or the like; the silicon oxide film outside the element isolation trench is removed by using a CMP (Chemical Mechanical Polishing) method or the like; and, in this way, an insulating film such as a silicon oxide film is embedded inside the element isolation trench. Such an element isolation method is called an STI (Shallow Trench Isolation) method.

Next, a p-type well PW is formed in the semiconductor substrate 100. The p-type well PW is formed by ion-implanting a p-type impurity (for example, boron (B) etc.) using a silicon oxide film (not shown) as a through film.

Next, an insulating film AHA (104, 105, 106) and a memory gate electrode portion MG are formed on the semiconductor substrate 100. First, an $Al_2O_3$ film 104 is formed on the semiconductor substrate 100. The $Al_2O_3$ film 104 can be formed by, for example, a CVD method or the like. Its film thickness is about 8 nm. Next, a HfSiO film 105 is deposited on the $Al_2O_3$ film 104 with a film thickness of about 10 nm by, for example, a CVD method or the like. The HfSiO film 105 serves as a charge storage portion of the memory cell and becomes an intermediate layer constituting the insulating film AHA. Next, an $Al_2O_3$ film 106 is deposited on the HfSiO film 105 with a film thickness of about 8 nm by the CVD method. This makes it possible to form the insulating film AHA including the $Al_2O_3$ film 104, the HfSiO film 105, and the $Al_2O_3$ film 106. In this case, the HfSiO film 105 is formed as a charge storage portion inside the insulating film AHA, but a hafnium oxide-based material with high dielectric constant (a high dielectric constant material containing hafnium and oxygen) can be used as the charge storage portion. As such a material, besides HfSiO, for example, $HfO_2$, HfAlO, or the like may be used. Further, a film thickness of each film constituting the insulating film AHA is not limited to the above, and is appropriately adjusted according to, for example, an operation method etc. of the memory cell.

Next, a polysilicon film 107 having a size of about 40 nm is deposited on the insulating film AHA (104, 105, 106) by using a CVD method or the like. The polysilicon film 107 serves as a memory gate electrode portion MG. An n-type impurity (for example, arsenic (As) or phosphorus (P)) may be ion-implanted into the polysilicon film 107 and thermally diffused. Next, a silicon oxide film (not shown) having a size of about 10 nm and a silicon nitride film 108 having a size of about 60 nm are formed on the polysilicon film 107 by a CVD method or the like.

Next, the silicon nitride film 108 is left in a memory gate electrode portion forming region by using a photolithography technique and a dry etching technique. Thereafter, the polysilicon film 107 and the like are etched by using the silicon nitride film 108 as a mask (FIG. 8).

Next, as shown in FIG. 9, the HfSiO film 105 whose side surface has been exposed is side-etched below the polysilicon film (MG) 107. That is, by etching (side-etching) only the HfSiO film 105 by a length (L) of about 5 to 10 nm by using an etching method having high isotropic and high selectivity (for example, atomic layer etching), a gap SP is formed. At this time, other films such as $Al_2O_3$ films 104 and 106 are not etched.

Figure 10:
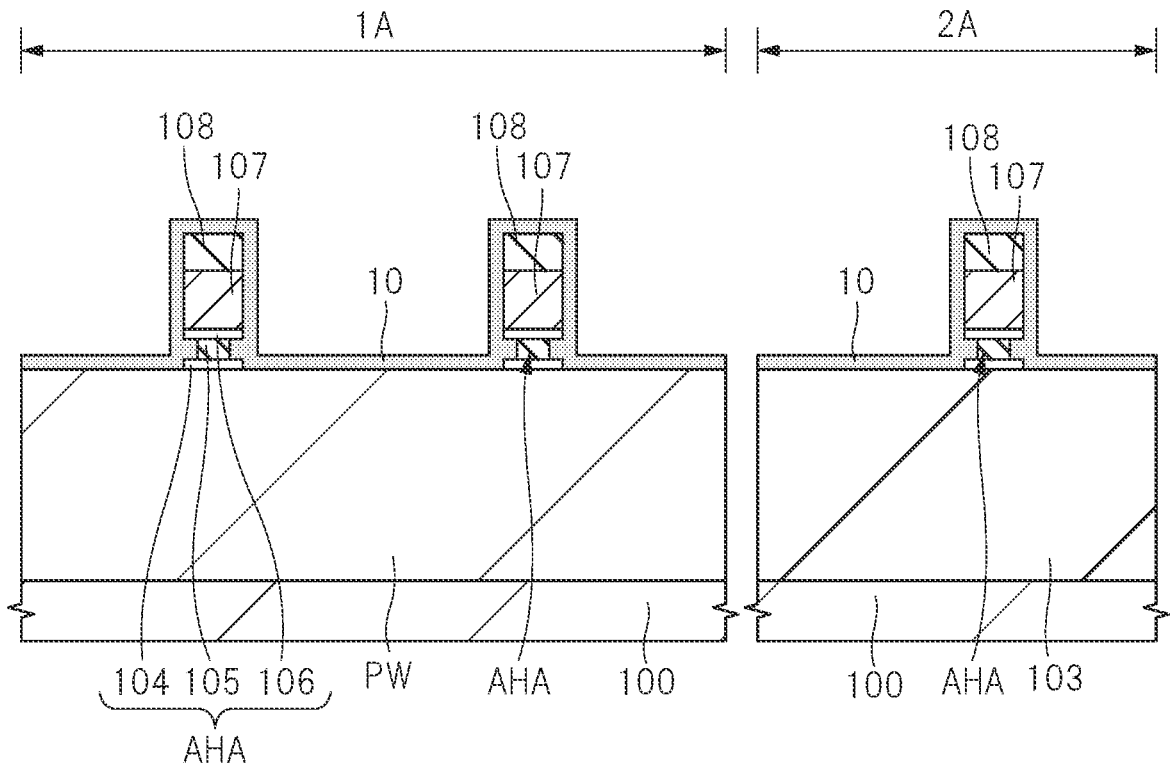
FIG. 10 is a cross-sectional view showing a manufacturing process of the semiconductor device according to the first embodiment.
Figure 11:
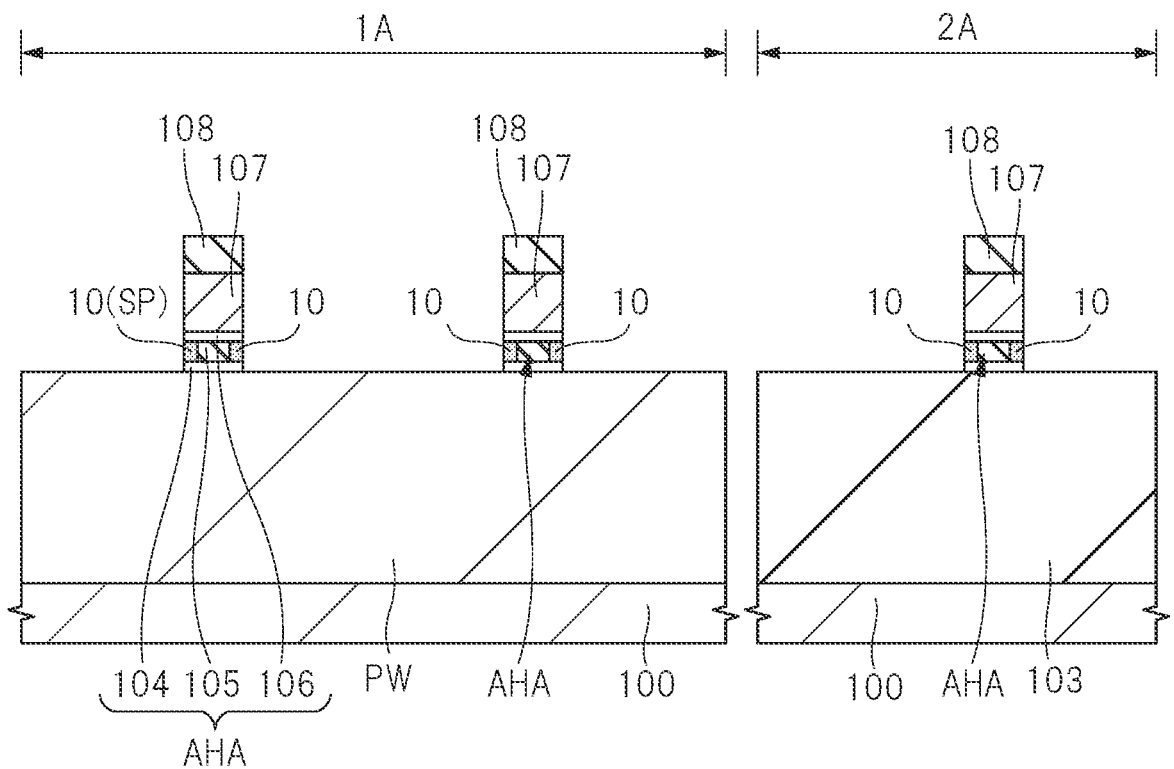
FIG. 11 is a cross-sectional view showing a manufacturing process of the semiconductor device according to the first embodiment.

Next, as shown in FIG. 10, as a dummy embedded film 10, a SiGe film having such a film thickness (for example, about 10 to 20 nm, about twice the film thickness of L) as to be embedded in a side-etching portion (gap SP) of the HfSiO film 105 is deposited by using a CVD method or the like. Next, by removing the dummy embedded film (SiGe film) a predetermined film thickness from the surface by isotropic dry etching, the dummy embedded film (SiGe film) remains only in the side-etching portion (gap SP) (FIG. 11). An end point of the dry etching can be a time when a gas containing Si or Ge generated by the etching is detected and an amount of detected gas is clearly reduced. By using such a detection method, the dummy embedded film (SiGe film) can be left only in the side-etching portion (gap SP) with high accuracy.

Figure 12:
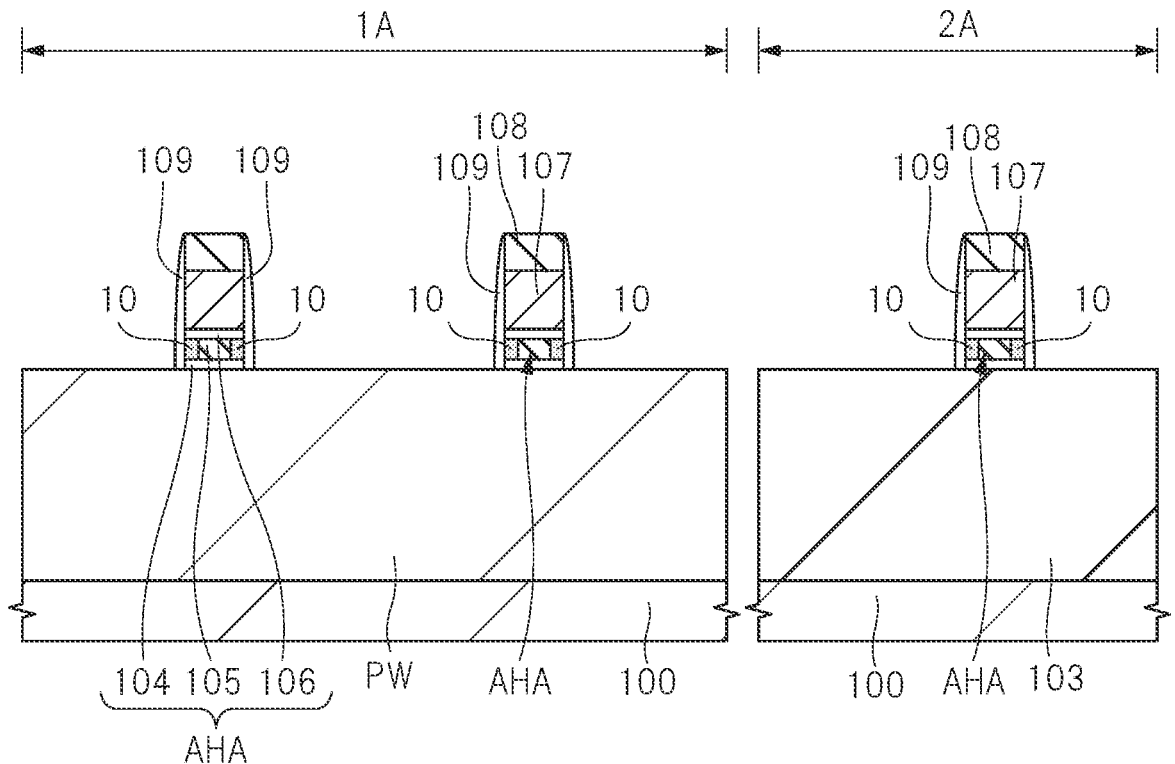
FIG. 12 is a cross-sectional view showing a manufacturing process of the semiconductor device according to the first embodiment.

Next, as shown in FIG. 12, a sidewall film (side wall insulating film) 109 is formed on a side wall portion of the polysilicon film (MG) 107. For example, a silicon nitride film is deposited on the semiconductor substrate 100 by using a CVD method or the like. The sidewall film 109 is formed by removing the silicon nitride film a predetermined film thickness from its surface by anisotropic dry etching.

Figure 13:
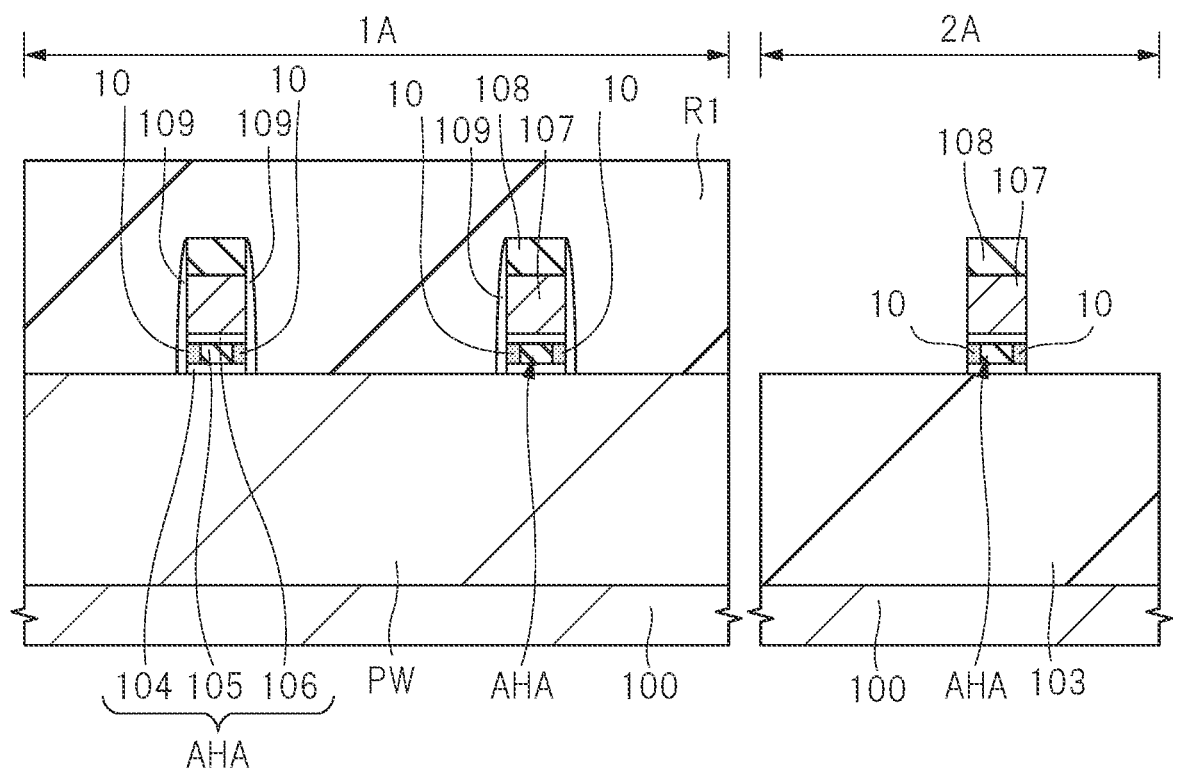
FIG. 13 is a cross-sectional view showing a manufacturing process of the semiconductor device according to the first embodiment.
Figure 14:
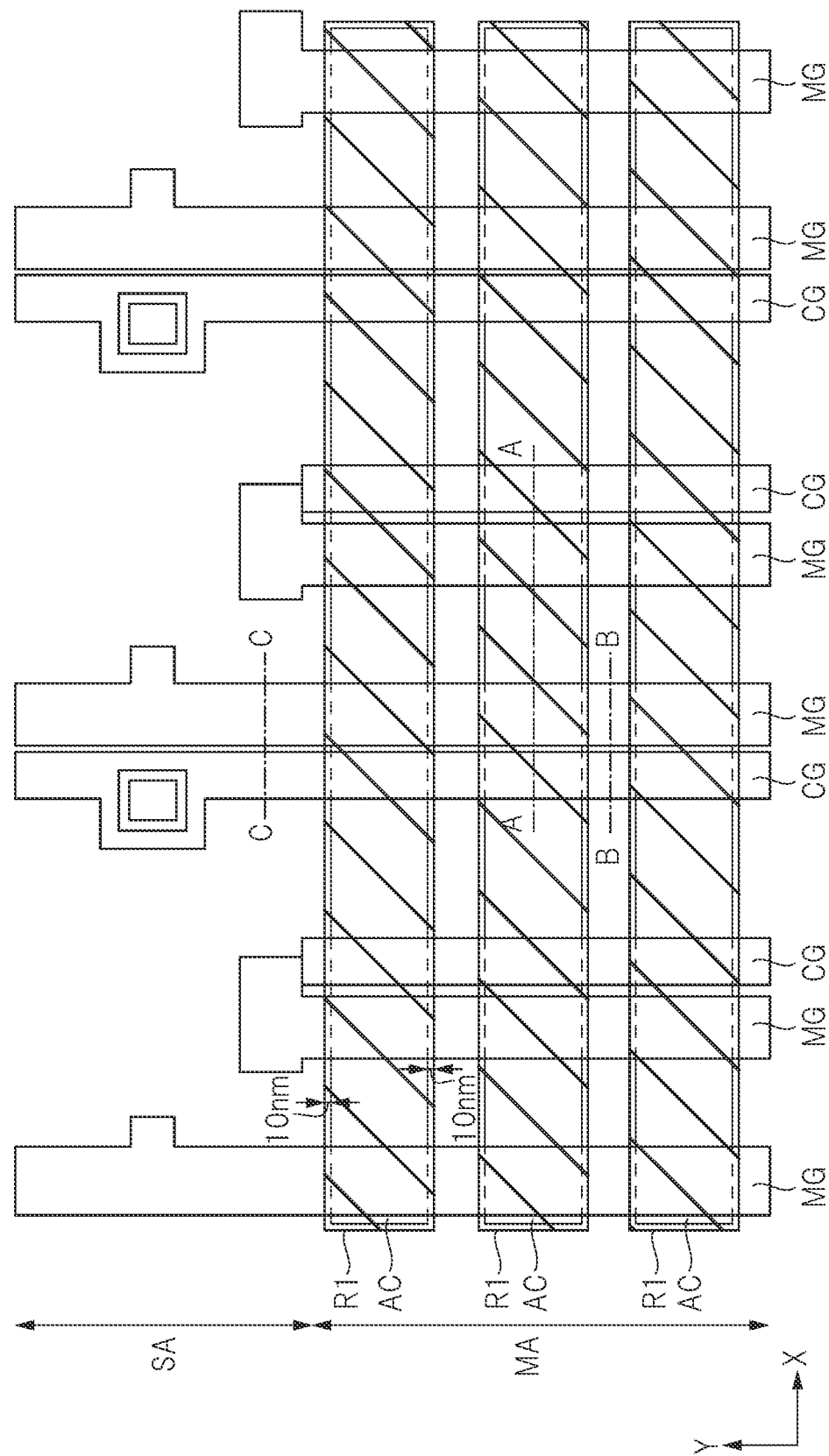
FIG. 14 is a plan view showing a manufacturing process of the semiconductor device according to the first embodiment.
Figure 15:
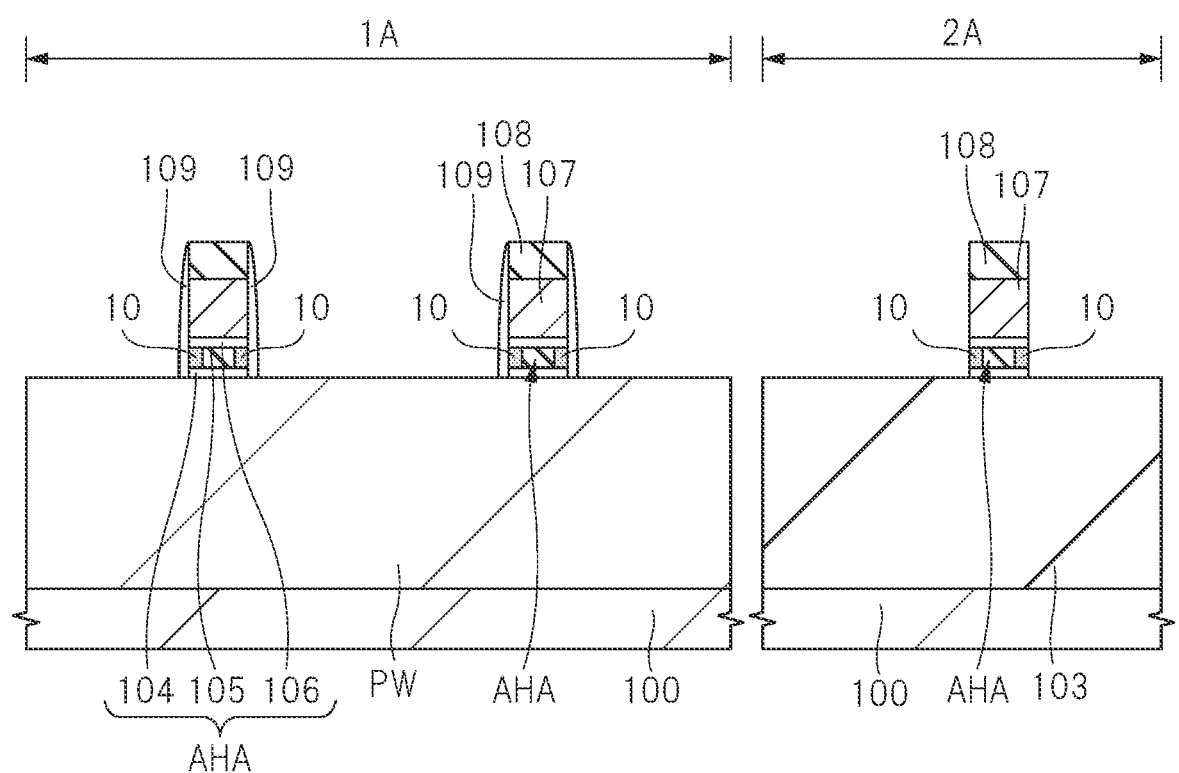
FIG. 15 is a cross-sectional view showing a manufacturing process of the semiconductor device according to the first embodiment.

Next, as shown in FIGS. 13 and 14, the polysilicon film (MG) 107 over the semiconductor substrate 100 (p type well PW, active region AC) is covered with a photoresist R1, and only the dummy embedded film (SiGe film) 10 below the polysilicon film (MG) 107 over the element isolation region 103 is exposed (FIG. 13). A forming region of the photoresist R1 is illustrated in FIG. 14. Incidentally, the forming region of the photoresist is set considering an alignment error of the photoresist R1. For example, as shown in FIG. 14, the photoresist R1 has such a size as to be capable of ensuring a margin of 10 nm from an end of the active region AC. Then, the sidewall film 109 on the element isolation region 103 is removed by the etching using the photoresist R1 as a mask and, further, the photoresist film R1 is removed (FIG. 15).

Figure 16:
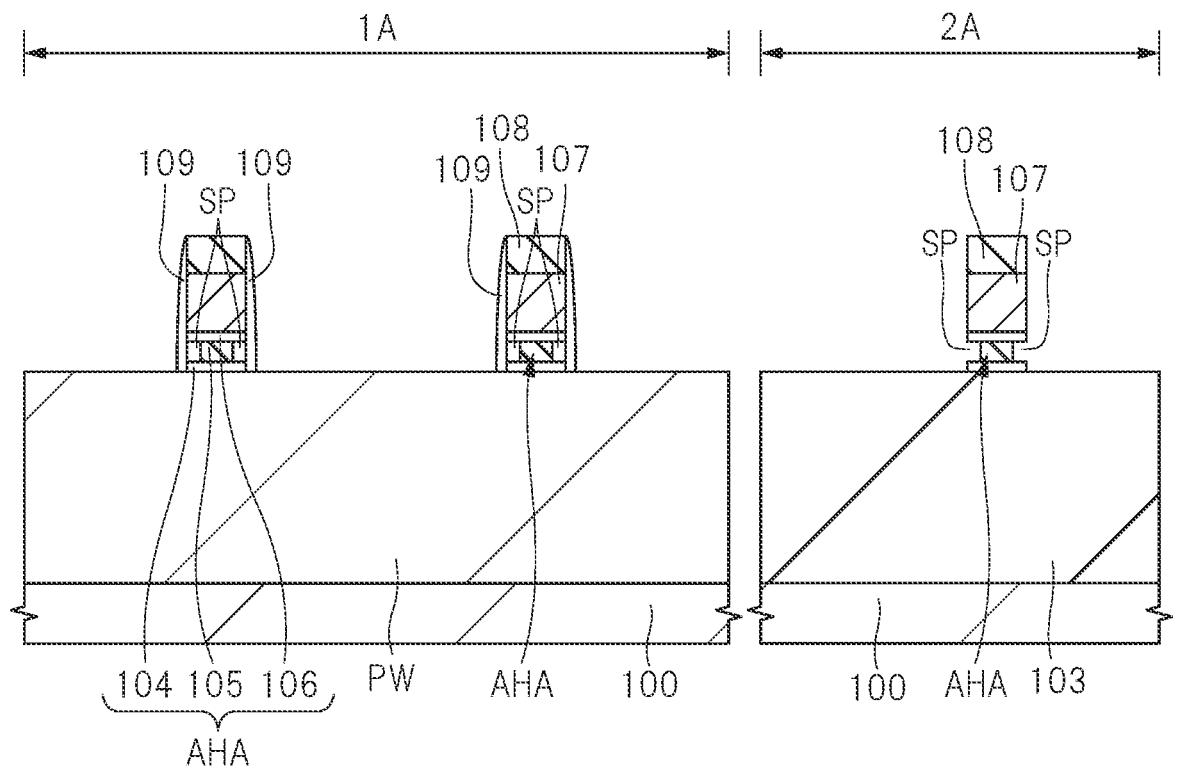
FIG. 16 is a cross-sectional view showing a manufacturing process of the semiconductor device according to the first embodiment.

Next, the dummy embedded film (SiGe film) 10 below the polysilicon film (MG) 107 is removed by wet etching. At this time, since the dummy embedded film (SiGe film) 10 below the polysilicon film (MG) 107 on the element isolation region 103 shown in FIG. 15 is exposed, it is easily wet-etched and, further, etching liquid from this portion enters below the polysilicon film (MG) 107 on the active region AC. Consequently, in the memory gate electrode portion MG on the active region AC, the dummy embedded film (SiGe film) 10 inside the sidewall film 109 is removed in spite of existence of the sidewall film 109 and the gap SP is formed (FIG. 16).

Figure 17:
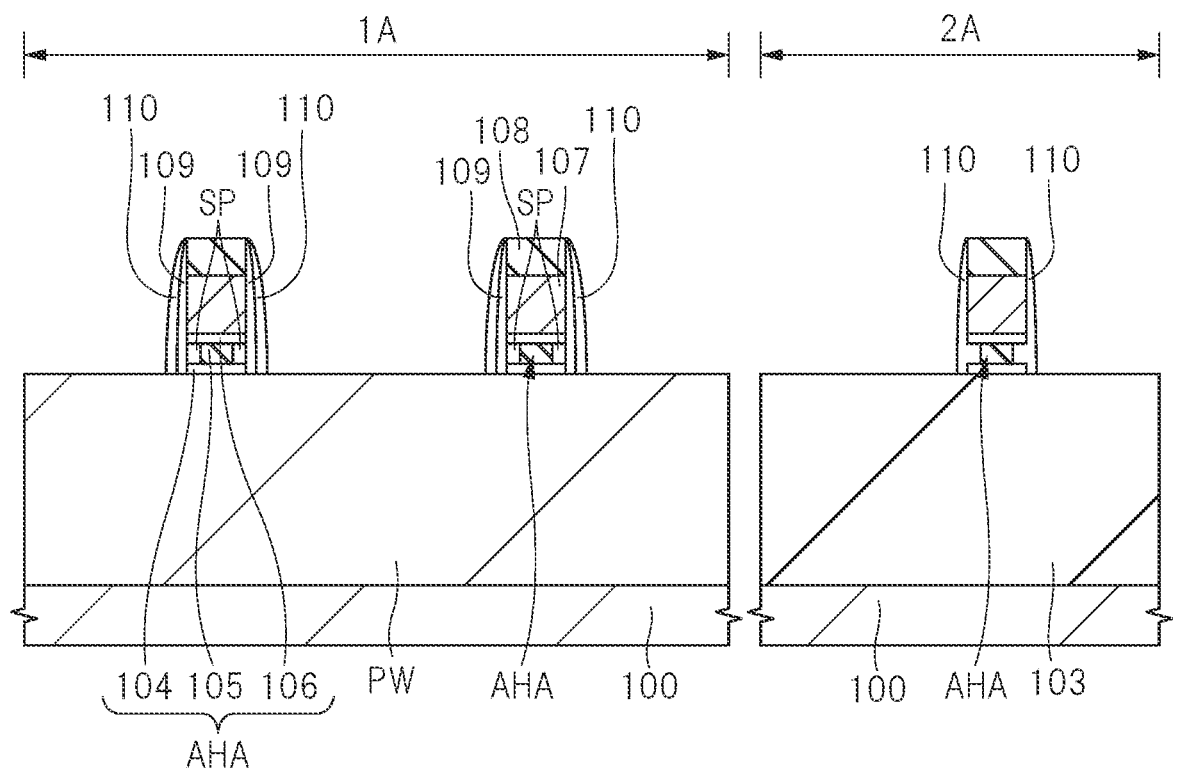
FIG. 17 is a cross-sectional view showing a manufacturing process of the semiconductor device according to the first embodiment.

Next, as shown in FIG. 17, a sidewall film (side wall insulating film) 110 is formed on the side wall portion of the polysilicon film (MG) 107. For example, a silicon nitride film is deposited on the semiconductor substrate 100 by using a CVD method or the like. At this time, a gap below the memory gate electrode portion MG on the element isolation region 103 is filled with the silicon nitride film. Then, the sidewall film 110 is formed by removing the silicon nitride film a predetermined film thickness from the surface by anisotropic dry etching. Here, the double sidewall films 109 and 110 are formed on the side surfaces of the polysilicon film (MG) 107 and the insulating film AHA over the semiconductor substrate 100 (p-type well PW), while the sidewall film 110 is formed on the side surfaces of the polysilicon film (MG) 107 and the insulating film AHA on the element isolation region 103, thereby embedding the gap SP therein.

Figure 18:
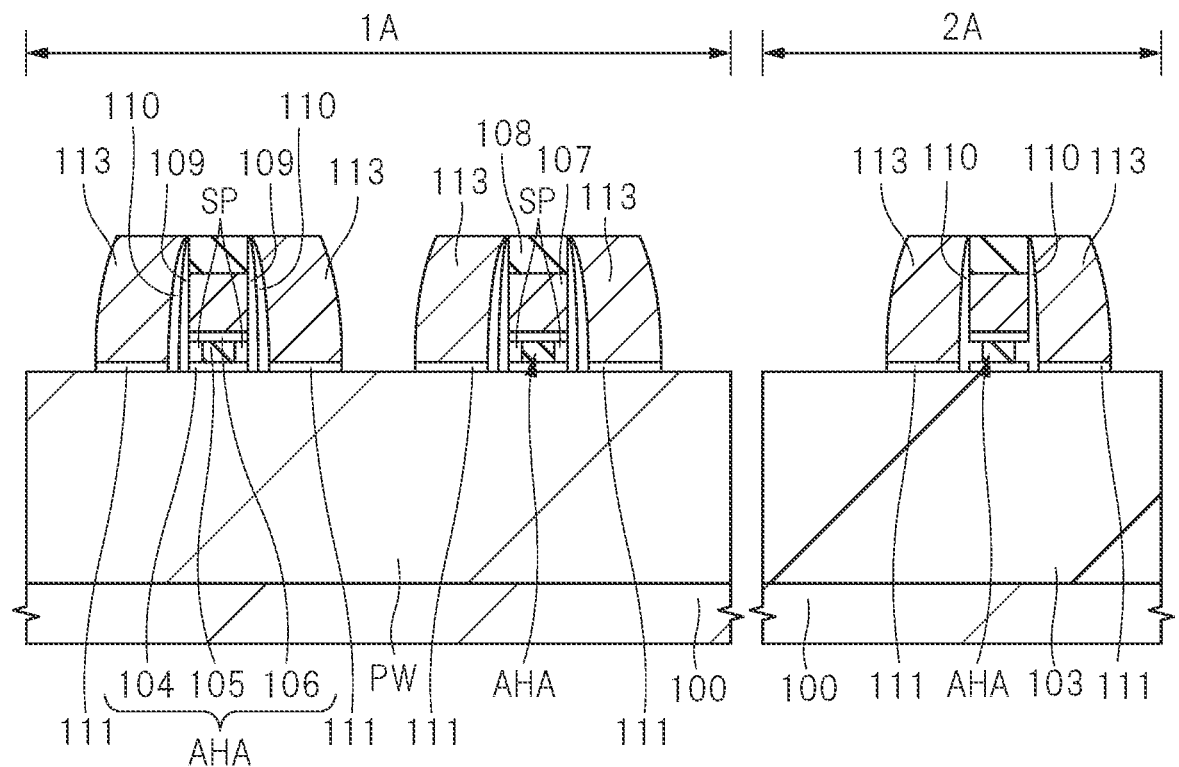
FIG. 18 is a cross-sectional view showing a manufacturing process of the semiconductor device according to the first embodiment.

Next, as shown in FIG. 18, a sidewall-shaped polysilicon film 113 is formed on the side wall portion of the polysilicon film (MG) 107 via the silicon oxide film 111. For example, the polysilicon film 111 is formed over the semiconductor substrate 100 by thermal oxidation, and the polysilicon film 113 is further deposited by a CVD method or the like to etch back the polysilicon film 113. In this etching back step, the polysilicon film 113 is removed a predetermined film thickness from the surface by anisotropic dry etching. By this step, the polysilicon film 113 can be left in a sidewall shape (side wall film shape) on the side wall portion of the polysilicon film (MG) 107. This polysilicon film 113 serves as the control gate electrode portion CG.

Figure 19:
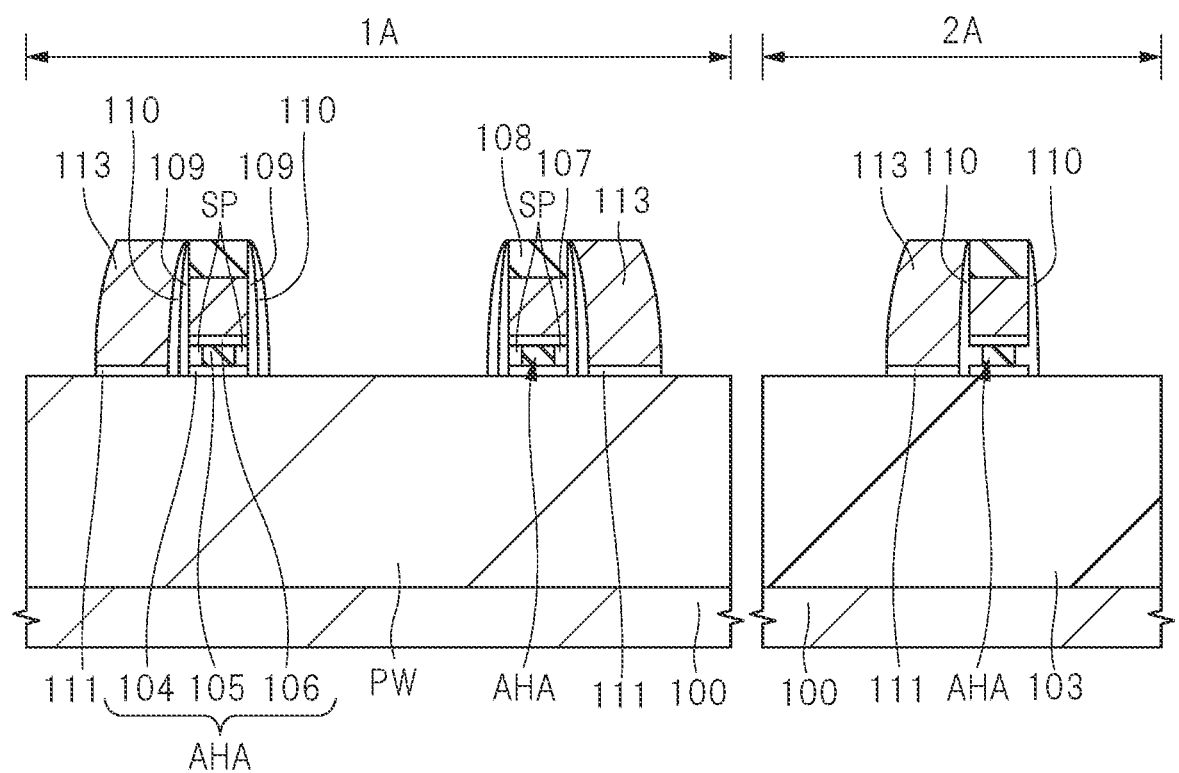
FIG. 19 is a cross-sectional view showing a manufacturing process of the semiconductor device according to the first embodiment.

Next, as shown in FIG. 19, the polysilicon film 113 on one side (source region side) of the polysilicon film (MG) 107 is removed by using a photolithography technique and a dry etching technique.

Figure 20:
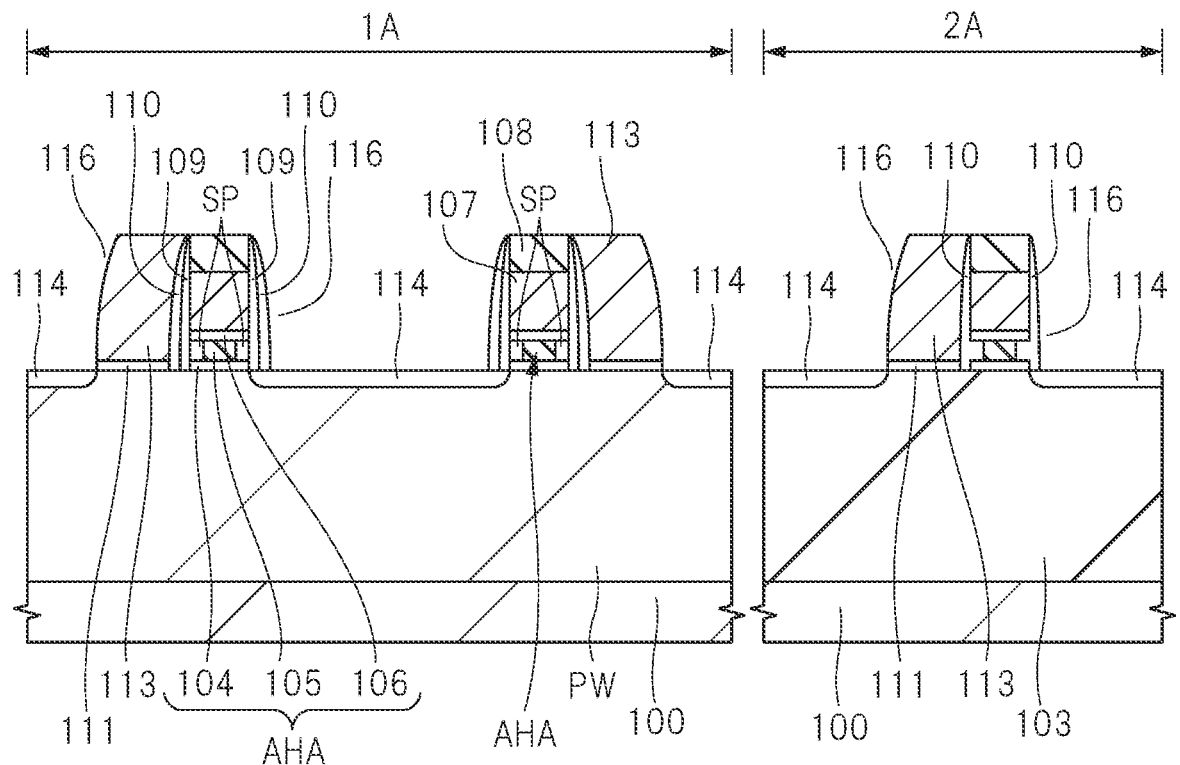
FIG. 20 is a cross-sectional view showing a manufacturing process of the semiconductor device according to the first embodiment.

Next, as shown in FIG. 20, an n-type impurity such as arsenic (As) or phosphorus (P) is injected into the semiconductor substrate 100 (p-type well PW) by using the polysilicon film 113 or the like as a mask and, consequently, the n-type semiconductor region 114 is formed. At this time, the n⁻ type semiconductor region 114 is formed in a self-aligned manner on the side wall of the polysilicon film 113, and is also formed in a self-aligned manner on the side wall of the sidewall film 110.

Figure 21:
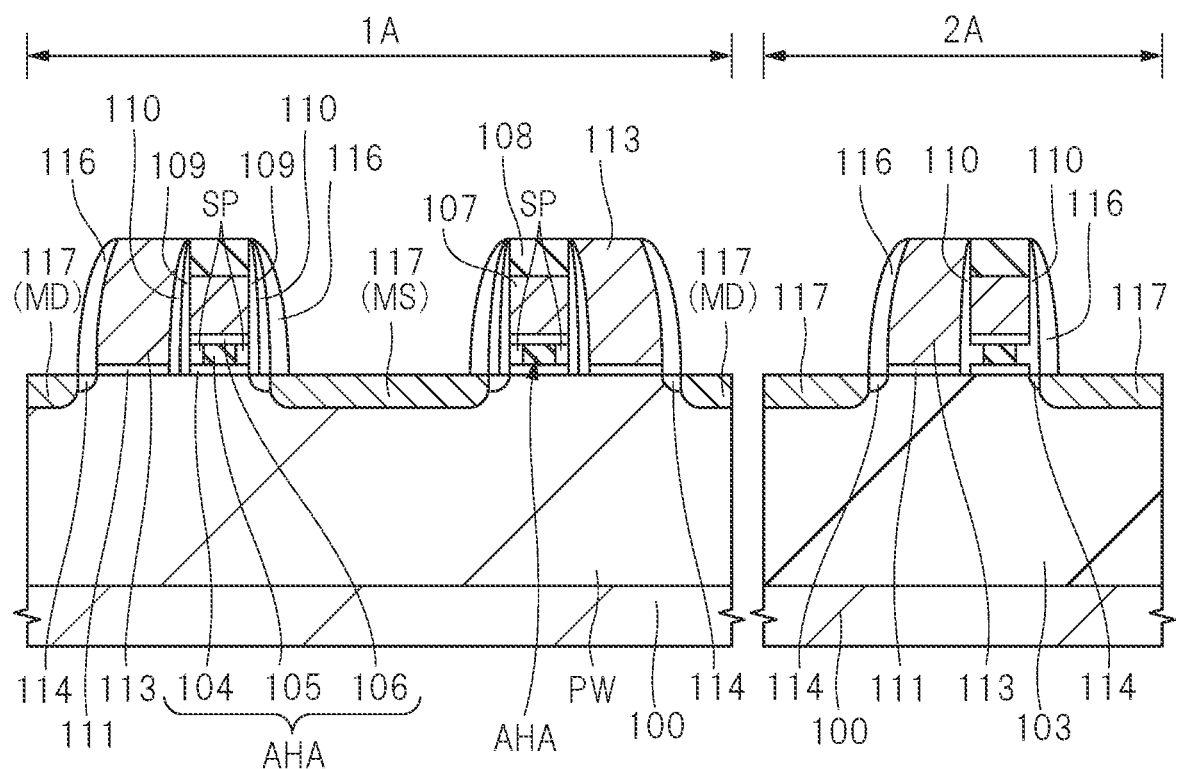
FIG. 21 is a cross-sectional view showing a manufacturing process of the semiconductor device according to the first embodiment.

Next, as shown in FIG. 21, a sidewall film 116 is formed on the side wall portions of the polysilicon film 113 and the sidewall film 110. For example, a silicon oxide film is deposited over the semiconductor substrate 100 by using a CVD method or the like. The sidewall film 116 is formed by removing the silicon oxide film a predetermined film thickness from the surface by anisotropic dry etching. Next, a n⁺ type semiconductor region 117 is formed by injecting an n-type impurity such as arsenic (As) or phosphorus (P) using the polysilicon film 113 and the sidewall film 116 as masks. At this time, the n⁺ type semiconductor region 117 is formed in a self-aligned manner on the sidewall film 116. The n⁺ type semiconductor region 117 is higher in impurity concentration and deeper in injunction depth than the n-type semiconductor region 114. By this step, a source region MS and a drain region MD, each of which is composed of an n⁻ type semiconductor region 114 and an n⁺ type semiconductor region 117, are formed.

Figure 22:
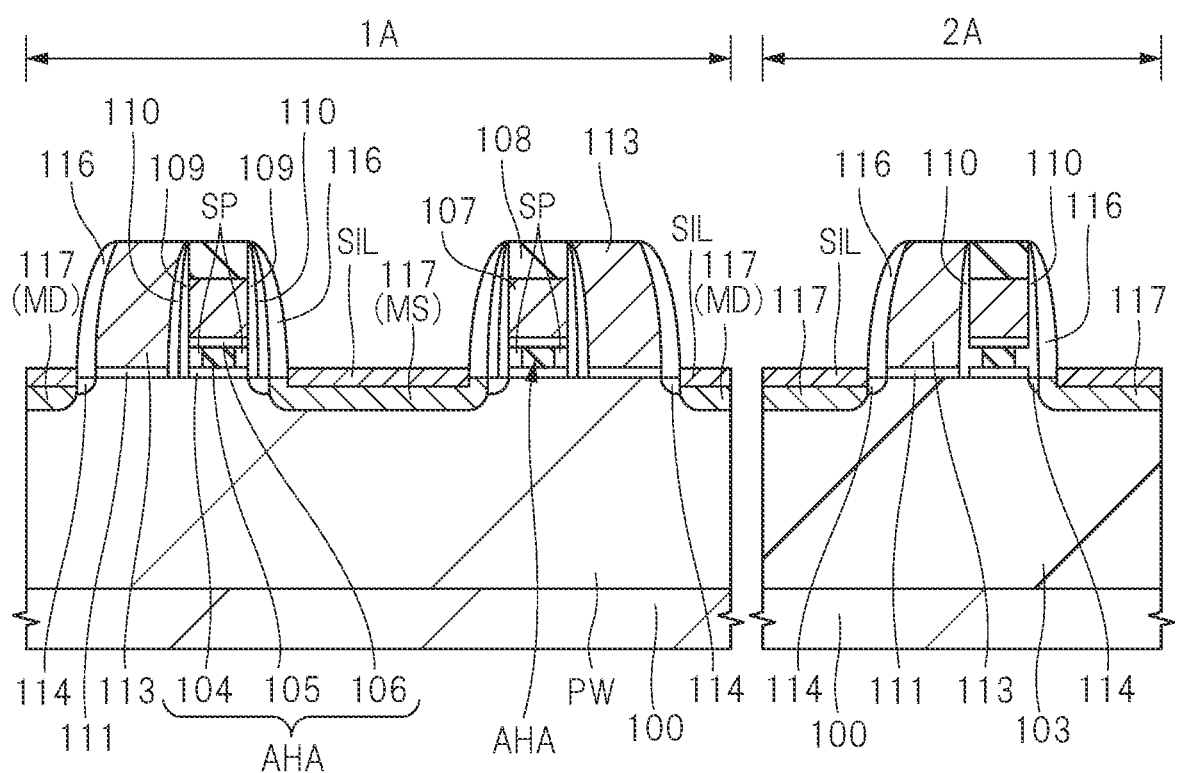
FIG. 22 is a cross-sectional view showing a manufacturing process of the semiconductor device according to the first embodiment.

Next, as shown in FIG. 22, a metal silicide film SIL is formed on the source region MS and the drain region MD by using a salicide technique. First, a metal film (not shown) is formed over the semiconductor substrate 100, and the semiconductor substrate 100 is heat-treated to cause the source region MS and drain region MD to react with the metal film. Thus, the metal silicide film SIL is formed on the source region MS and the drain region MD. The above-mentioned metal film is made of, for example, a nickel (Ni) or nickel-platinum (Pt) alloy, and can be formed by a sputtering method or the like. Then, the unreacted metal film is removed. Use of this metal silicide film SIL can reduce diffusion resistance, contact resistance, and the like.

Figure 23:
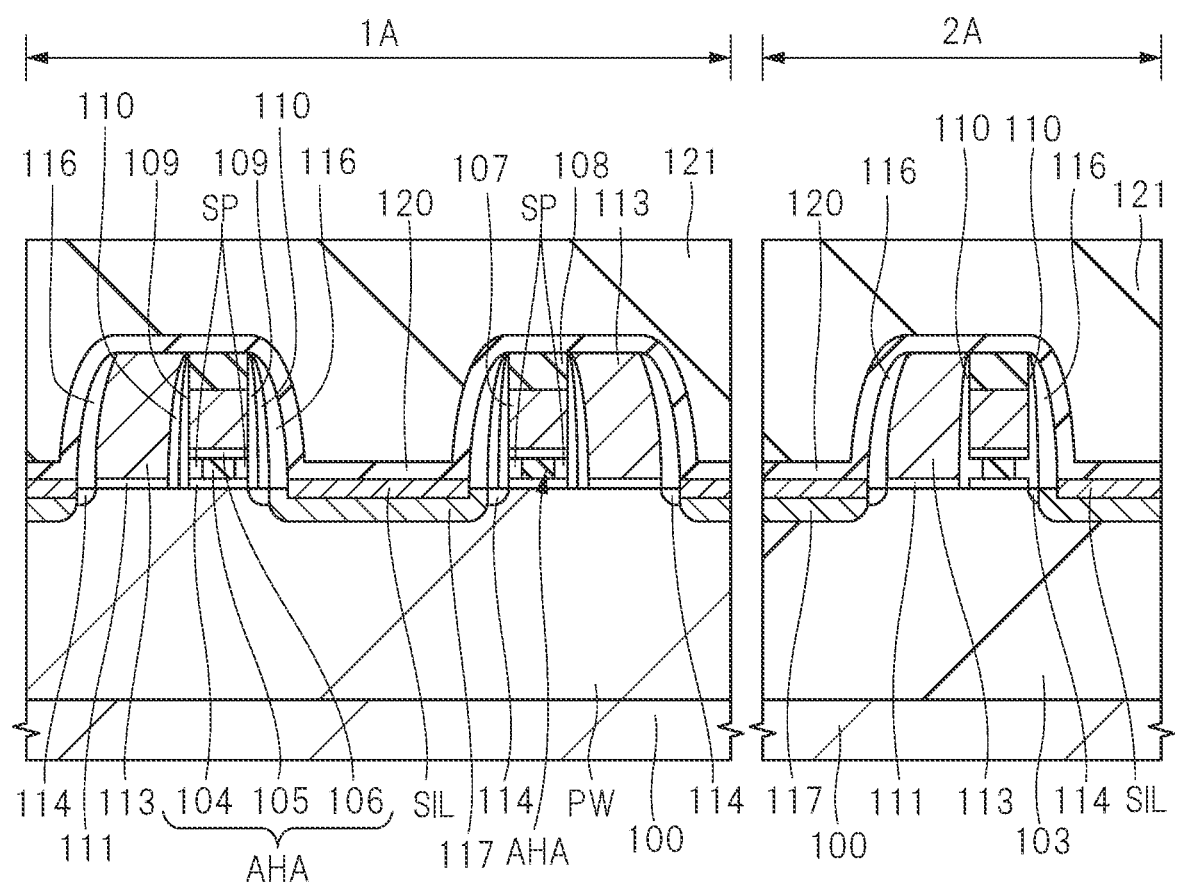
FIG. 23 is a cross-sectional view showing a manufacturing process of the semiconductor device according to the first embodiment.

Next, as shown in FIG. 23, a silicon nitride film 120 and a silicon oxide film 121 are deposited over the semiconductor substrate 100 by a CVD method or the like.

Figure 24:
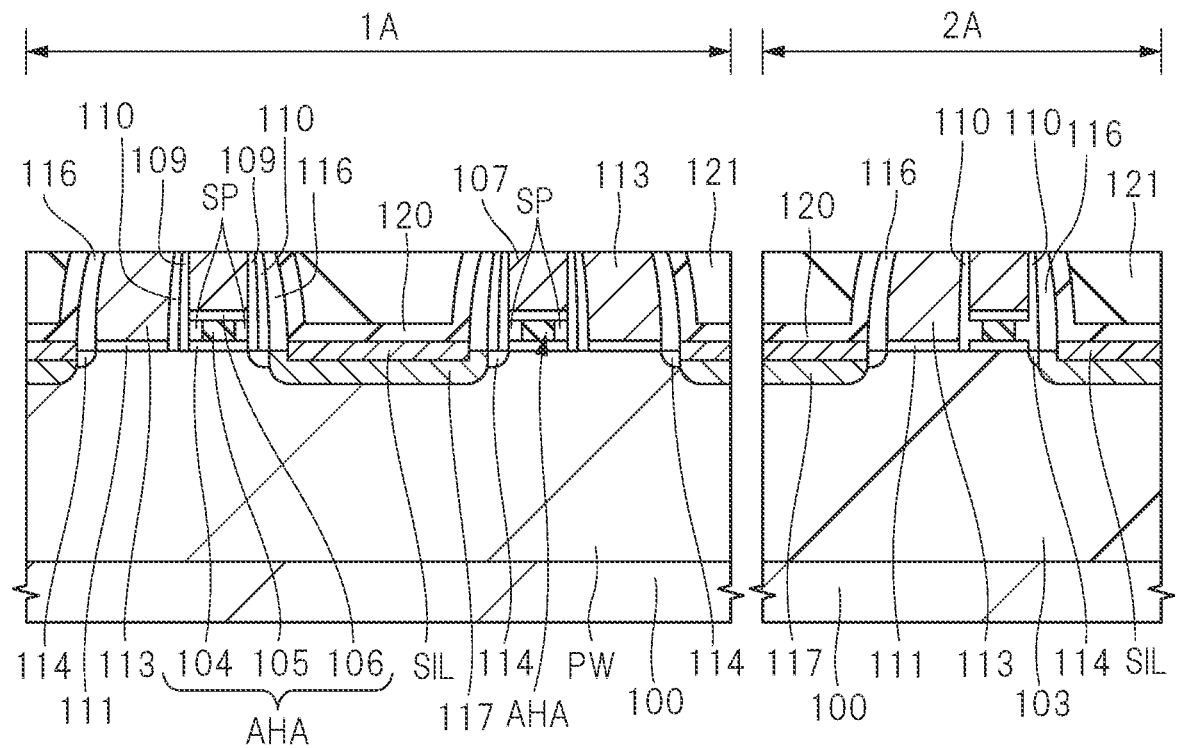
FIG. 24 is a cross-sectional view showing a manufacturing process of the semiconductor device according to the first embodiment.

Next, as shown in FIG. 24, an upper portion of the silicon oxide film 121 or the like is removed until the surface of the polysilicon film 107 is exposed. For example, the upper portion of the silicon oxide film 121 or the like is removed until the surface of the polysilicon film 107 is exposed by using a CMP method, a wet etching method, or the like.

Figure 25:
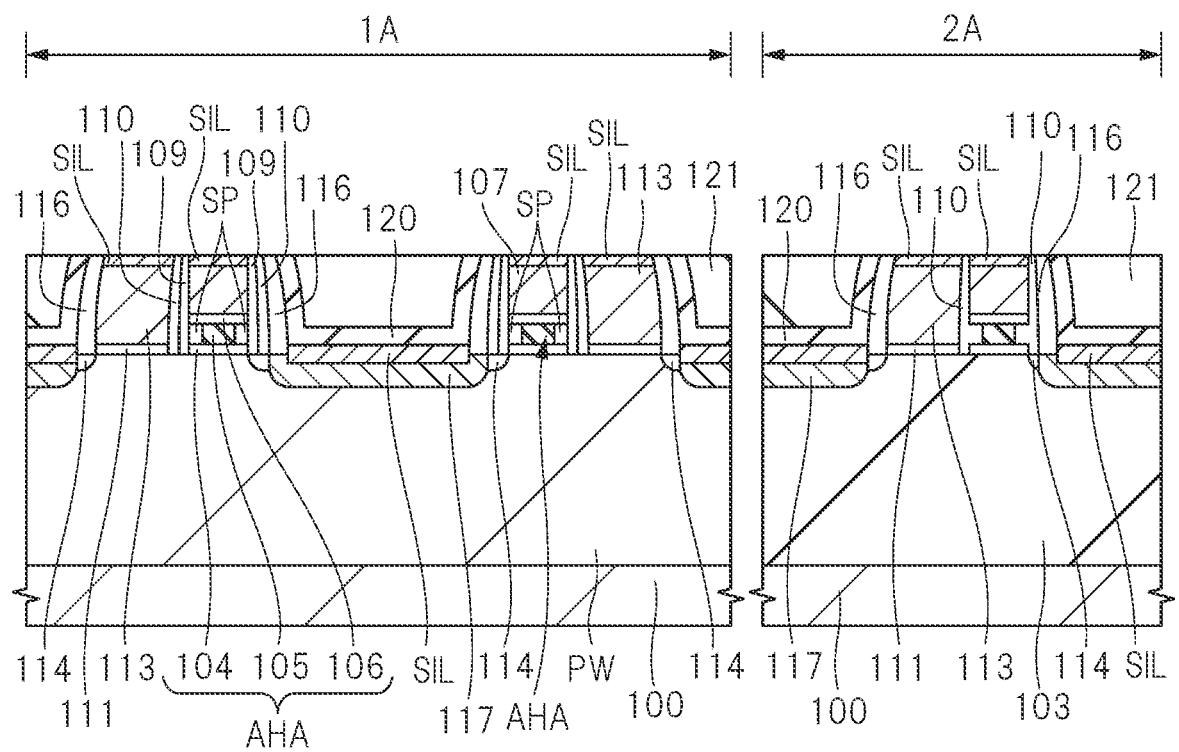
FIG. 25 is a cross-sectional view showing a manufacturing process of the semiconductor device according to the first embodiment.

Next, as shown in FIG. 25, a metal silicide film SIL is formed on the polysilicon film (memory gate electrode portion MG) 107 and the polysilicon film (control gate electrode portion CG) 113 by using a salicide technique. This metal silicide film SIL can be formed in the same manner as those on the source region MS and the drain region MD.

Figure 26:
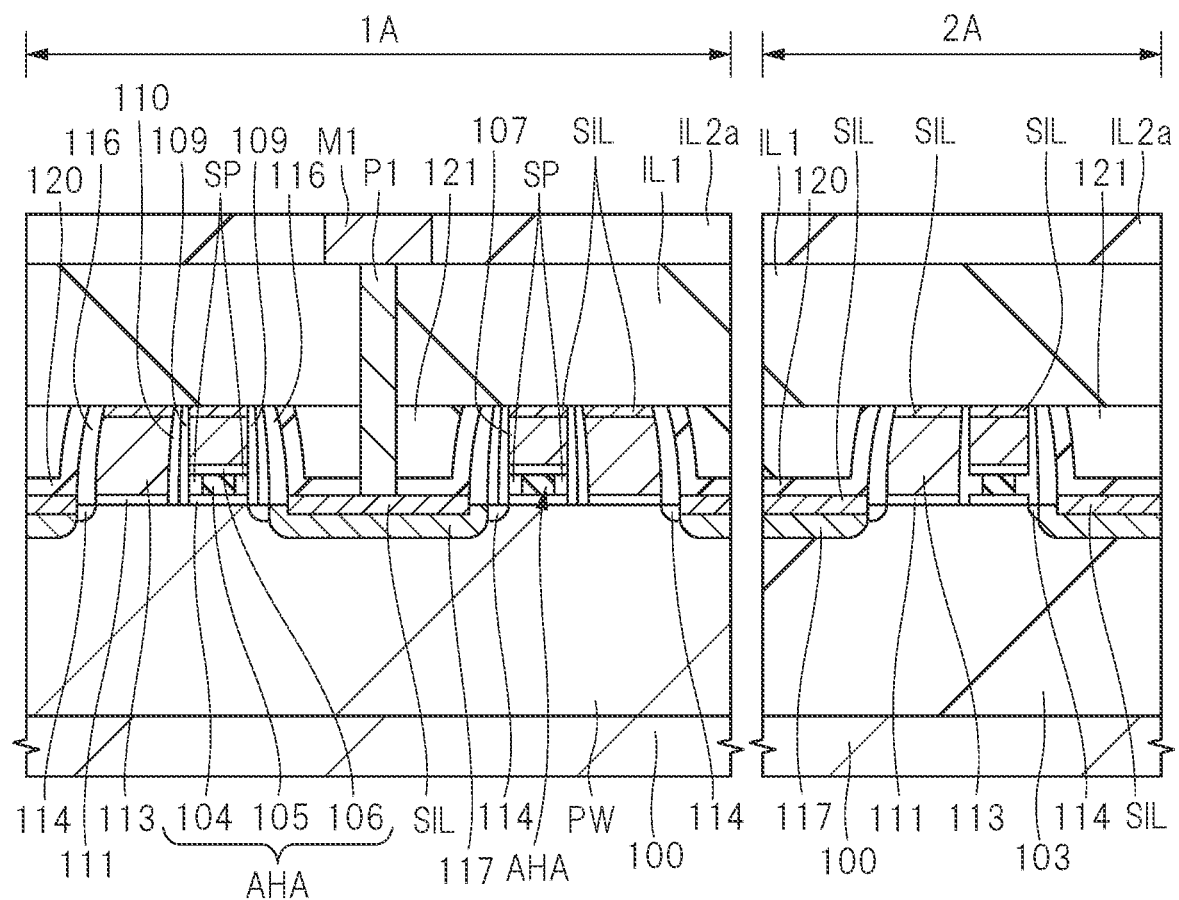
FIG. 26 is a cross-sectional view showing a manufacturing process of the semiconductor device according to the first embodiment.

Next, as shown in FIG. 26, a silicon oxide film IL1 is deposited as an interlayer insulating film on the metal silicide film SIL and the silicon oxide film 121, etc. by using a CVD method or the like. Next, a plug P1 is formed in the silicon oxide film IL1 and the like. The plug P1 can be formed by, for example, embedding a conductive film in a contact hole in the silicon oxide film IL1 or the like. Next, a wiring-trench insulating film IL2a is formed on the silicon oxide film IL1 to form a wiring M1. The wiring M1 can be formed by, for example, embedding a conductive film in a wiring trench in the wiring-trench insulating film IL2a (Damachine method). Thereafter, a wiring composed of two or more layers may be formed by repeating steps of forming the interlayer insulating film, the plug, and the wiring.

Second Embodiment

In the semiconductor device of the first embodiment (FIG. 1), the gap SP has been provided between the HfSiO film 205 in the insulating film AHA and the sidewall film 116, but the gap SP may be provided on a side surface of a laminated body of the insulating film AHA and the polysilicon film.

[Structural Explanation]

Figure 27:
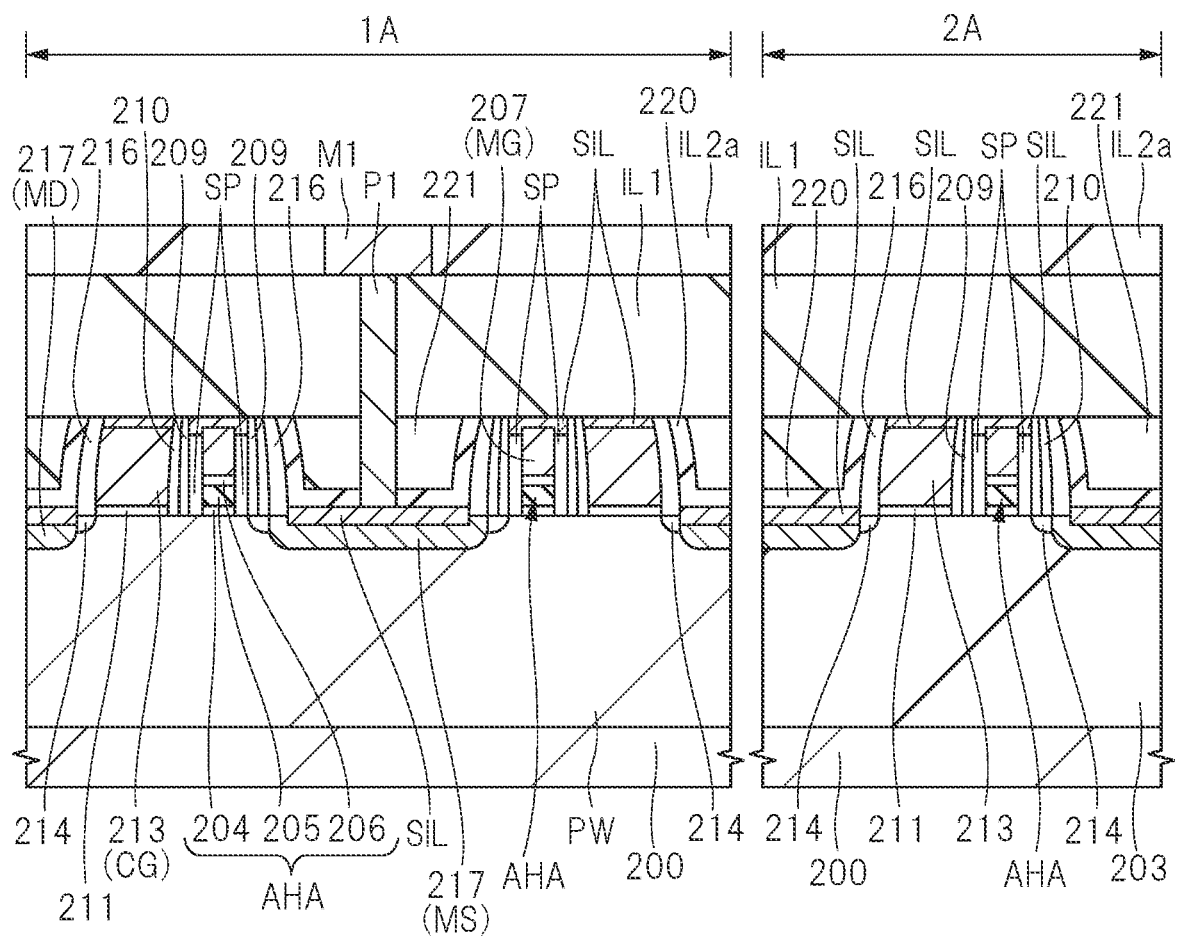
FIG. 27 is a cross-sectional view showing a semiconductor device according to a second embodiment.

FIG. 27 is a cross-sectional view showing a semiconductor device according to the present embodiment. Since a configuration other than a size and a shape of the gap SP is the same as that of the first embodiment, relevant reference numerals are given and a detailed description thereof will be omitted.

As shown in FIG. 27, a memory cell (element) includes a control transistor having a control gate electrode portion CG, and a memory transistor having a memory gate electrode portion MG. This memory cell has an insulating film AHA (204, 205, 206) arranged between the memory gate electrode portion (polysilicon film 207) MG and the semiconductor substrate 100 (p-type well PW). The insulating film AHA is composed of, for example, an $Al_2O_3$ film 204, an HfSiO film 205 on the $Al_2O_3$ film 204, and an $Al_2O_3$ film 206 on the HfSiO film 205.

Sidewall films (side wall insulating films, sidewall spacers) 209 and 210 are formed on side surfaces of the memory gate electrode portion MG and the insulating film AHA via the gap SP.

In this way, in the present embodiment, the gap SP is formed on the side surface of the entire insulating film AHA (204, 205, 206). In other words, the gap SP extends not only to an end portion of the HfSiO film 205 but also to the side surface of the memory gate electrode portion (polysilicon film 207) MG. Further in other words, the gap SP extends from a position between the HfSiO film 205 and the sidewall film 209 to a position between the memory gate electrode portion (polysilicon film 207) MG and the sidewall film 209.

Similarly to a case of the first embodiment, the above-mentioned configuration also avoids the deterioration (on-current is lowered, retention characteristics are lowered, writing/erasing speed of memory cell, and endurance characteristics are lowered) in the characteristics of the semiconductor device and, simultaneously, the effects (EPT reduction and leak suppression) of the above-mentioned insulating film AHA (204, 205, 206) can be enjoyed. Then, as compared with the case of the first embodiment, a gap SP (air-gap) between the memory gate electrode portion MG and the MG spacers (silicon oxide films 209 and 210) is provided, so that parasitic capacitance between the memory gate electrode portion MG and the source region MS or drain region MD can be reduced. As a result, the reading speed and the like are improved. Further, in addition to the release of electric charges from the HfSiO film 205, the release of electric charges from the HfSiO film 205 via other films (204 and 206) can be prevented, and the retention characteristics can be improved as compared with the case of the first embodiment.

Further, as will be described later, the present embodiment is simpler in the manufacturing process than the first embodiment, and has an advantage in terms of cost.
[Explanation of Manufacturing Method]

Next, a manufacturing method of the semiconductor device according to the present embodiment will be described with reference to FIGS. 28 to 37. FIGS. 28 to 37 are cross-sectional views each showing a manufacturing process of the semiconductor device according to the present embodiment. Incidentally, a detailed description of the same steps as those in the first embodiment will be omitted.

Figure 28:
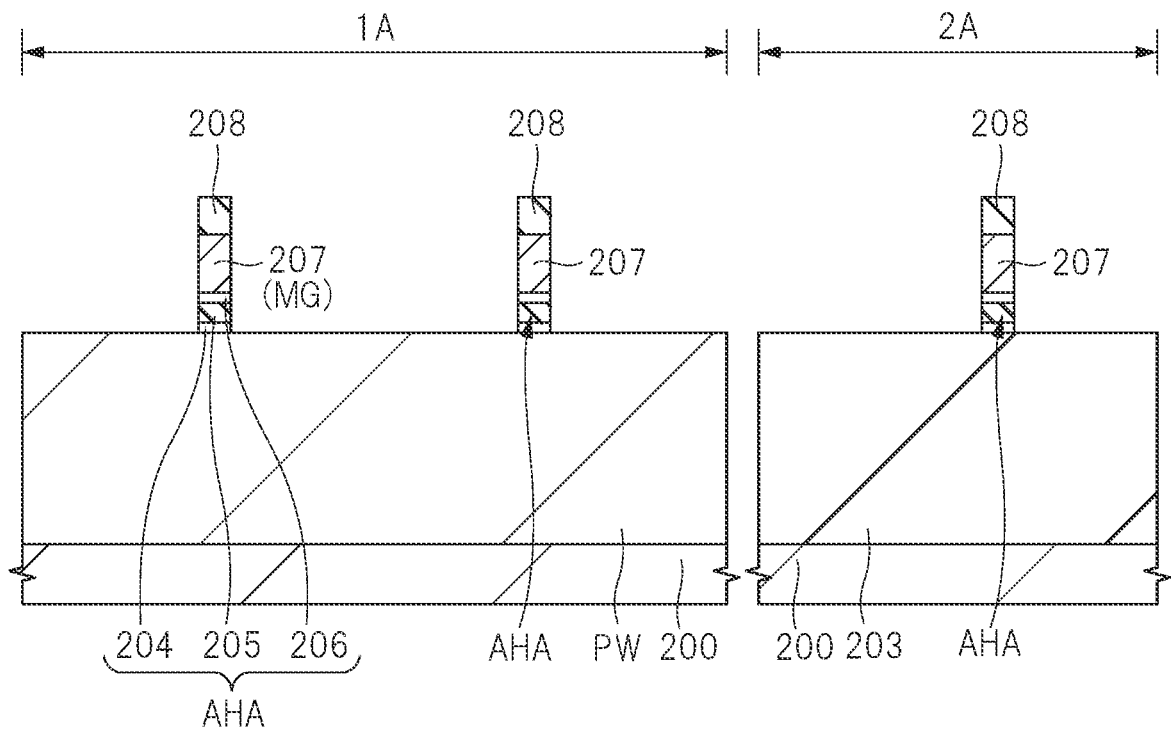
FIG. 28 is a cross-sectional view showing a manufacturing process of the semiconductor device according to the second embodiment.

First, as shown in FIG. 28, an element isolation region 103 is formed on a main surface of a semiconductor substrate 200, and a p-type well PW is formed in the semiconductor substrate 200. Next, an insulating film AHA (204, 205, 206) and a memory gate electrode portion MG are formed on and over the semiconductor substrate 200. First, an $Al_2O_3$ film 204 is deposited on the semiconductor substrate 200, and a HfSiO film 205 is deposited on the $Al_2O_3$ film 204. The HfSiO film 205 serves as a charge storage portion of a memory cell and becomes an intermediate layer constituting the insulating film AHA. Next, an $Al_2O_3$ film 206 is deposited on the HfSiO film 205. This makes it possible to form the insulating film AHA.

Next, a polysilicon film 207 is deposited on the insulating film AHA (204, 205, 206) and, then, a silicon oxide film (not shown) having a size of about 10 nm and a silicon nitride film 208 having a size of about 60 nm are formed by a CVD method or the like.

Next, the silicon nitride film 208 is left in a memory gate electrode portion forming region by using the photolithography technique and the dry etching technique. Thereafter, the polysilicon film 207 and the like are etched by using the silicon nitride film 208 as a mask.

Figure 29:
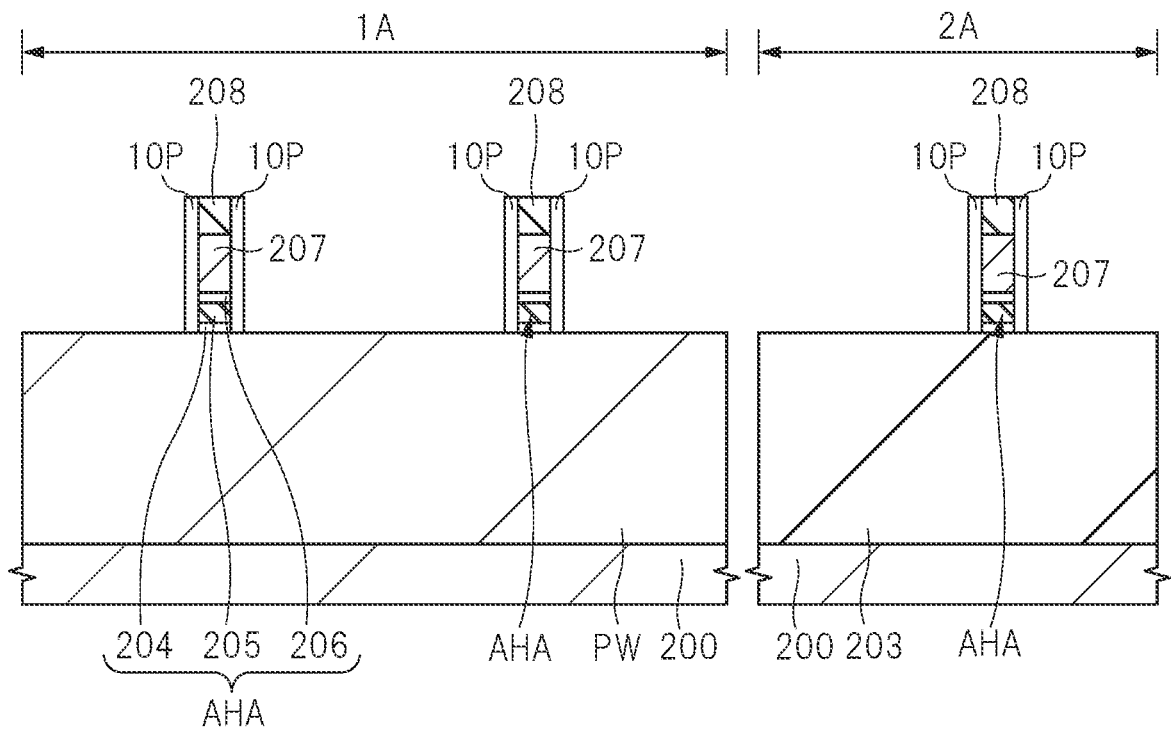
FIG. 29 is a cross-sectional view showing a manufacturing process of the semiconductor device according to the second embodiment.

Next, as shown in FIG. 29, a spacer film (sacrificial spacer film, side wall film) 10P made of a porous silicon oxide film is formed on a side wall portion of the polysilicon film (MG) 207. For example, a SiCO film is deposited on a semiconductor substrate 200 with a film thickness of about 8 nm by a CVD method or the like and, then, this film is removed a predetermined film thickness from the surface by an anisotropic dry etching, thereby forming a sidewall-shaped SiCO film on the side wall portion of the silicon film (MG) 207. Thereafter, the spacer film 10P made of a porous silicon oxide film can be formed by removing C atoms in the SiCO film through an usher treatment.

Figure 30:
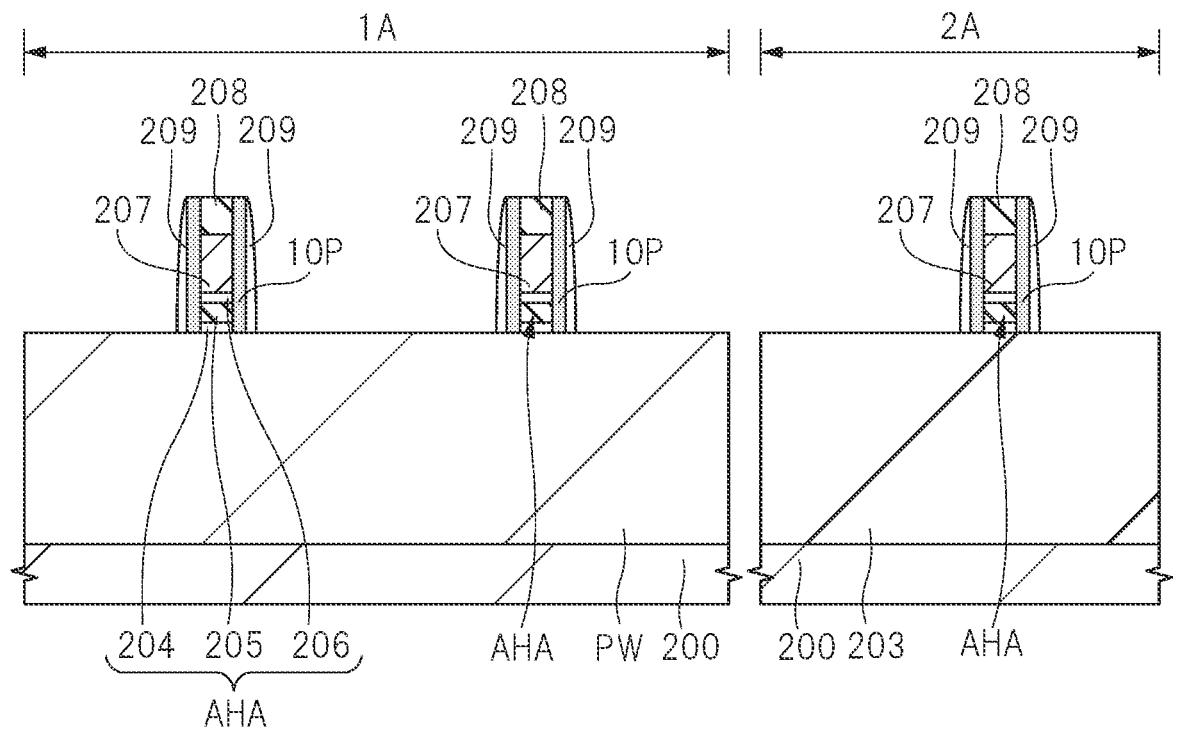
FIG. 30 is a cross-sectional view showing a manufacturing process of the semiconductor device according to the second embodiment.

Next, as shown in FIG. 30, a sidewall film (side wall insulating film) 209 is formed on the side wall portion of the polysilicon film (MG) 207 via the spacer film 10P. For example, a silicon nitride film is deposited on the semiconductor substrate 200 by using a CVD method or the like. Then, the sidewall film 209 is formed by removing the silicon nitride film a predetermined film thickness from the surface by anisotropic dry etching.

Figure 31:
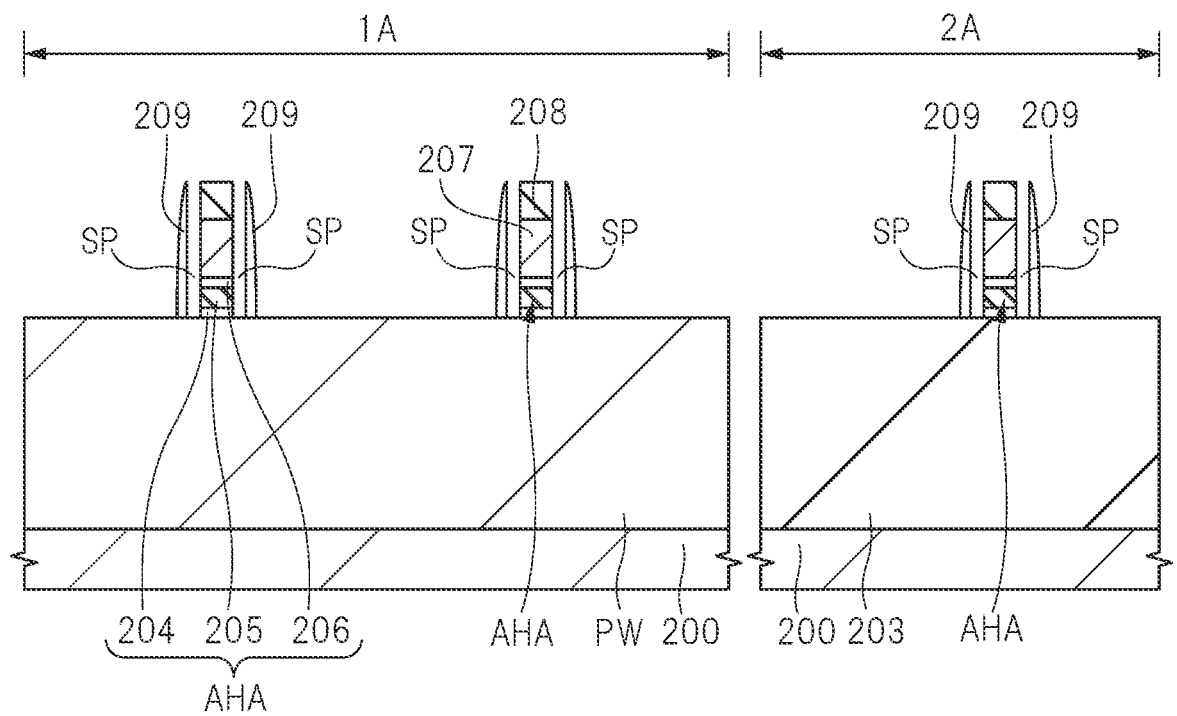
FIG. 31 is a cross-sectional view showing a manufacturing process of the semiconductor device according to the second embodiment.

Next, as shown in FIG. 31, the spacer film 10P that is made of a porous silicon oxide film having a large etching rate and is inside the sidewall film 209 is removed by etching. At this time, other films such as the HfSiO film 205 and the $Al_2O_3$ films 204 and 206 are not etched. Thus, a gap SP is formed on the side surfaces of the insulating film AHA (204, 205, 206) and the memory gate electrode portion (polysilicon film 207) MG.

Figure 32:
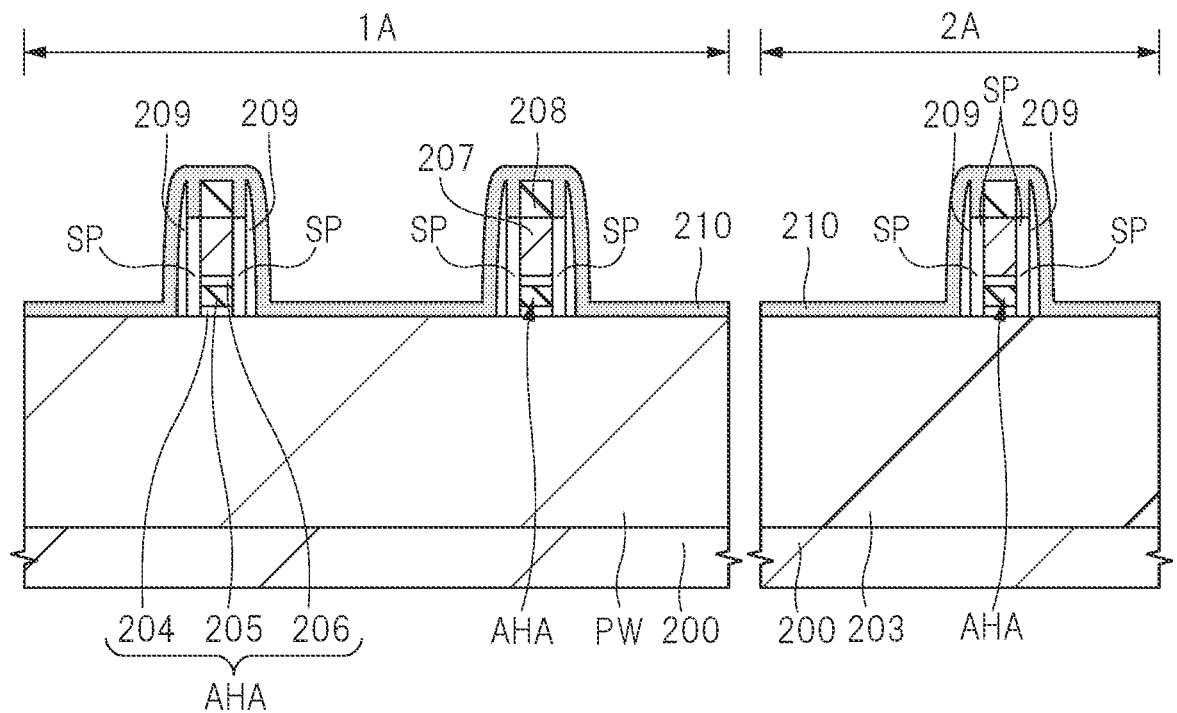
FIG. 32 is a cross-sectional view showing a manufacturing process of the semiconductor device according to the second embodiment.
Figure 33:
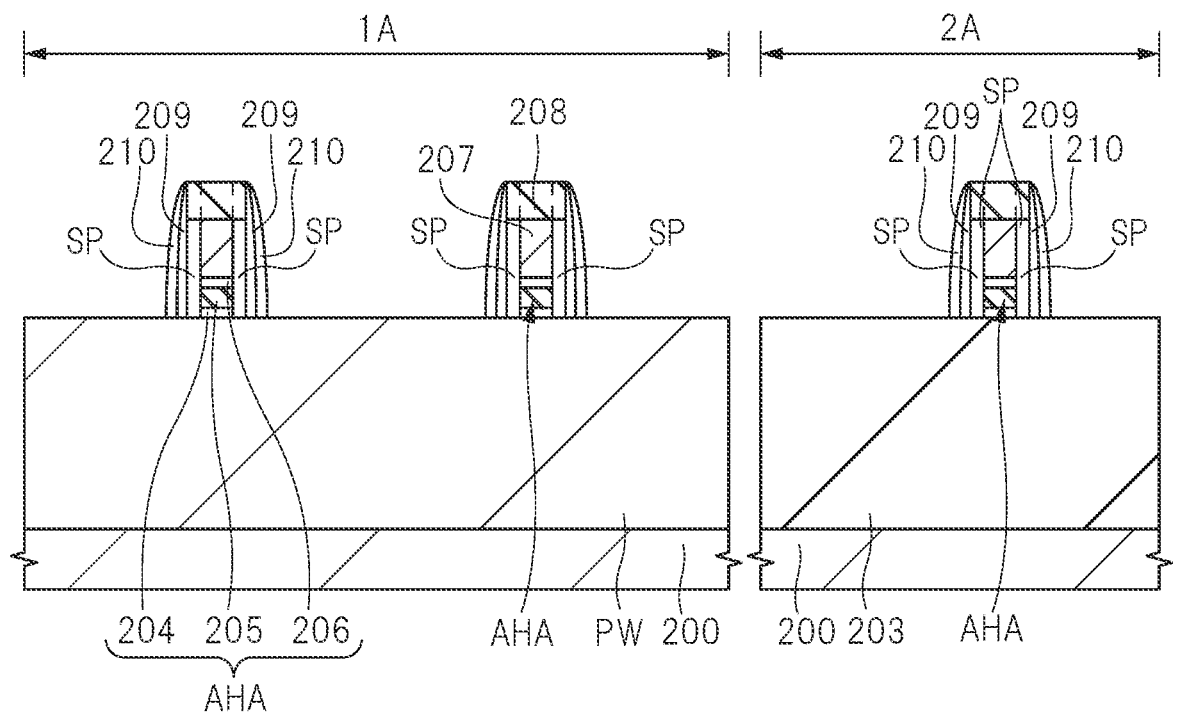
FIG. 33 is a cross-sectional view showing a manufacturing process of the semiconductor device according to the second embodiment.

Next, as shown in FIG. 32, a silicon nitride film 210 is deposited over the semiconductor substrate 200. At this time, the silicon nitride film (210) enters an upper portion the gap SP and fills the upper portion of the gap SP. Next, the sidewall film 210 is formed by removing the silicon nitride film 210 a predetermined film thickness from its surface by anisotropic dry etching (FIG. 33).

Figure 34:
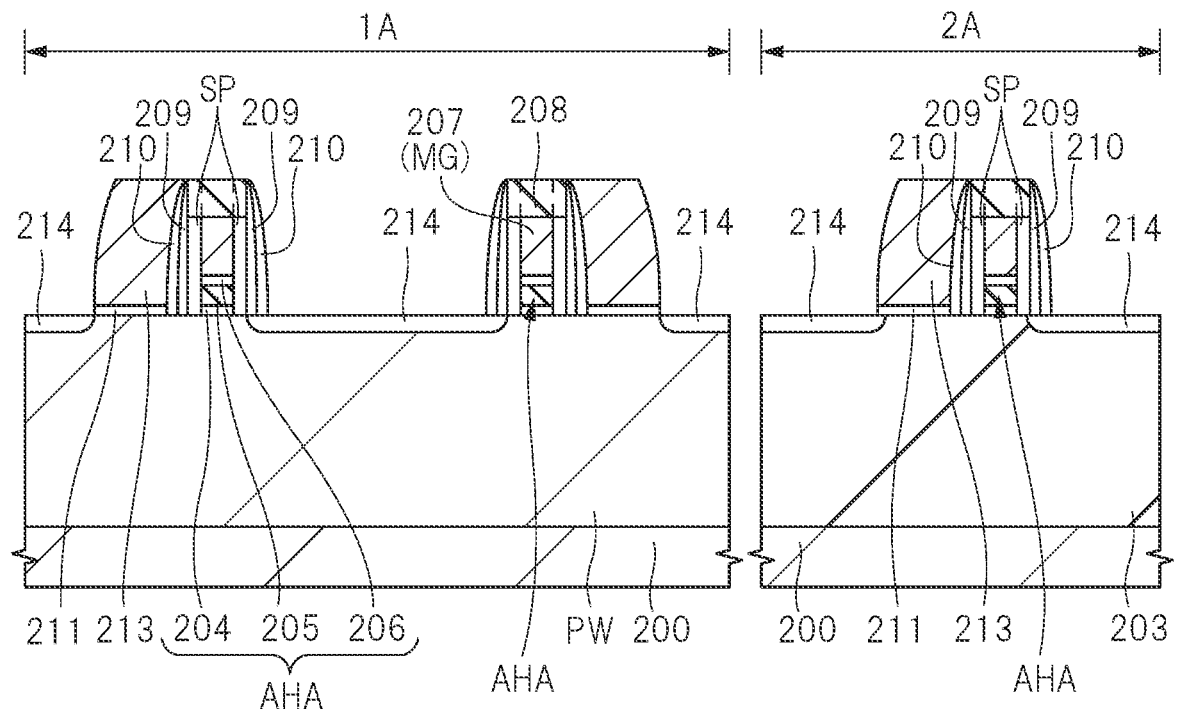
FIG. 34 is a cross-sectional view showing a manufacturing process of the semiconductor device according to the second embodiment.

Next, as shown in FIG. 34, a sidewall-shaped polysilicon film 213 is formed on the side wall portion of the memory gate electrode portion MG via the silicon oxide film 211, and the polysilicon film 213 on one side (source region side) of the memory gate electrode portion MG is removed. Then, an n⁻ type semiconductor region 214 is formed by injecting an n-type impurity such as arsenic (As) or phosphorus (P) into the semiconductor substrate 200 (p-type well PW) using the polysilicon film 213 or the like as a mask.

Figure 35:
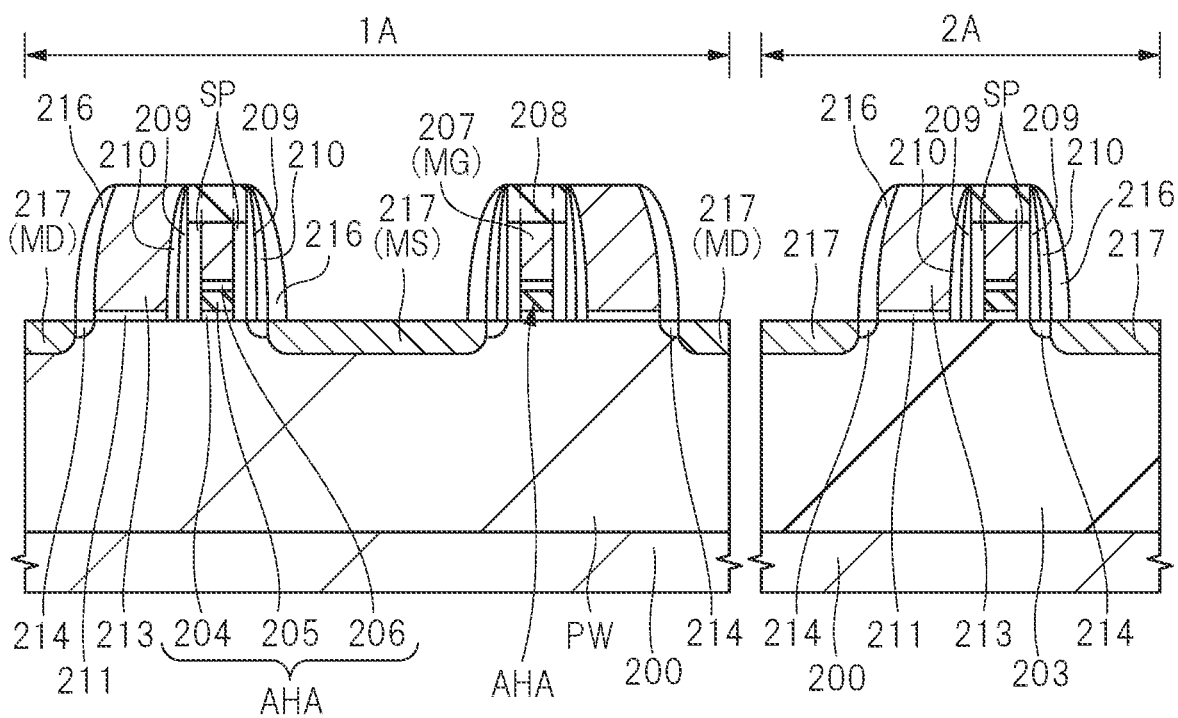
FIG. 35 is a cross-sectional view showing a manufacturing process of the semiconductor device according to the second embodiment.

Next, as shown in FIG. 35, a sidewall film 216 is formed on the side wall portions of the polysilicon film 213 and the sidewall film 210, and an n-type impurity such as arsenic (As) or phosphorus (P) is injected to form an n-type semiconductor region 217. By this step, a source region MS and a drain region MD each composed of the n-type semiconductor region 214 and the n⁺ type semiconductor region 217 are formed.

Figure 36:
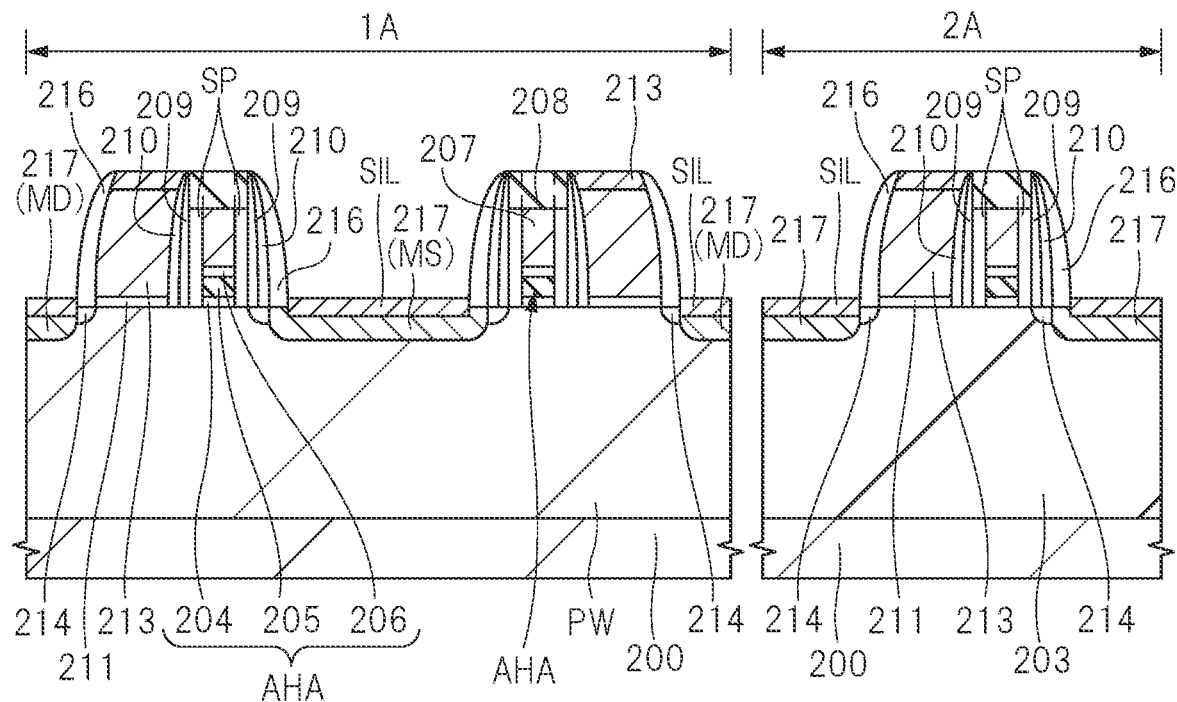
FIG. 36 is a cross-sectional view showing a manufacturing process of the semiconductor device according to the second embodiment.

Next, as shown in FIG. 36, a metal silicide film SIL is formed on the source region MS and the drain region MD by using the salicide technique.

Figure 37:
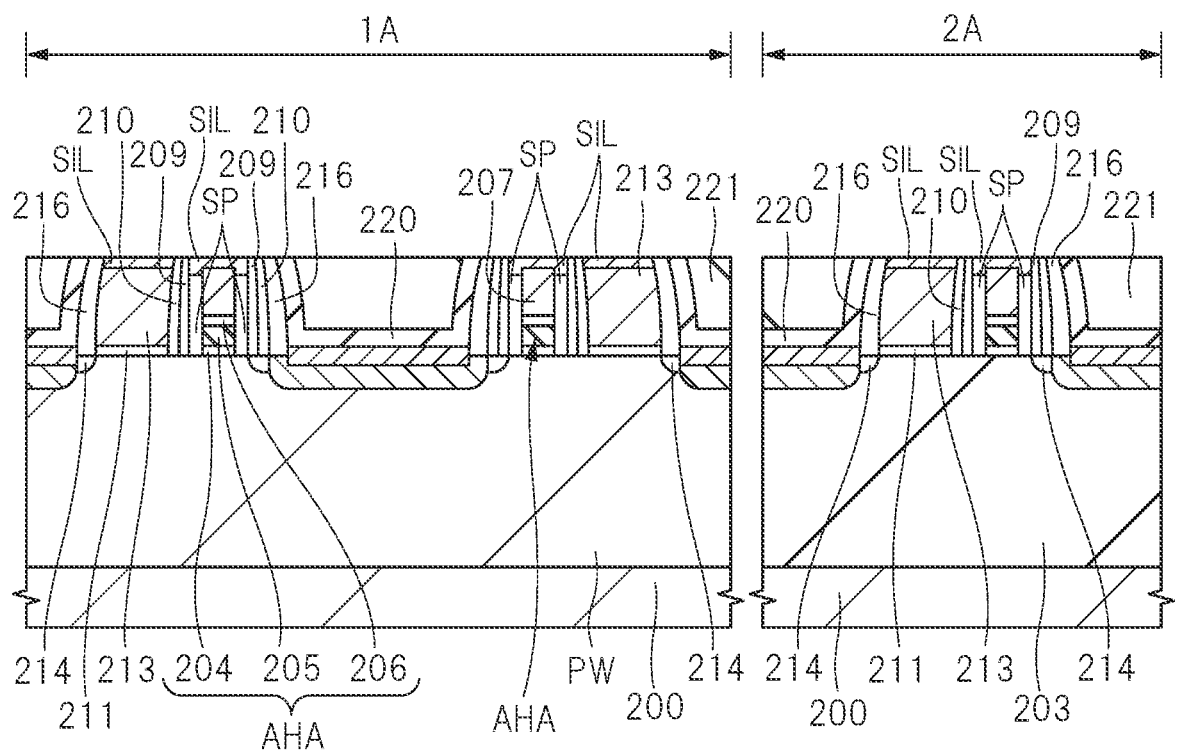
FIG. 37 is a cross-sectional view showing a manufacturing process of the semiconductor device according to the second embodiment.

Next, as shown in FIG. 37, a silicon nitride film 220 and a silicon oxide film 221 are deposited over the semiconductor substrate 200 by a CVD method or the like, and the upper portion of the silicon oxide film 221 or the like is exposed until the surface of the polysilicon film 207 is exposed. Next, a metal silicide film SIL is formed on the polysilicon film (memory gate electrode portion MG) 207 and the polysilicon film (control gate electrode portion CG) 213 by using the salicide technique.

Next, an silicon oxide film IL1 is formed as an interlayer insulating film on the metal silicide film SIL, the silicon oxide film 221, and the like, and a plug P1 is formed in the silicon oxide film IL1 and the like. Next, a wiring-trench insulating film IL2a is formed on the silicon oxide film IL1 to form a wiring M1 (see FIG. 27). Thereafter, a wiring having two or more layers may be formed by repeating steps of forming the interlayer insulating film, the plug, and the wiring.

Third Embodiment

In the first and second embodiments, after the memory gate electrode portions (polysilicon films 107 and 207) MG are formed, the sidewall-shaped control gate electrode portions (polysilicon films 113 and 213) have been formed. However, the memory gate electrode portion MG may have a sidewall shape.

First Application Example

Figure 38:
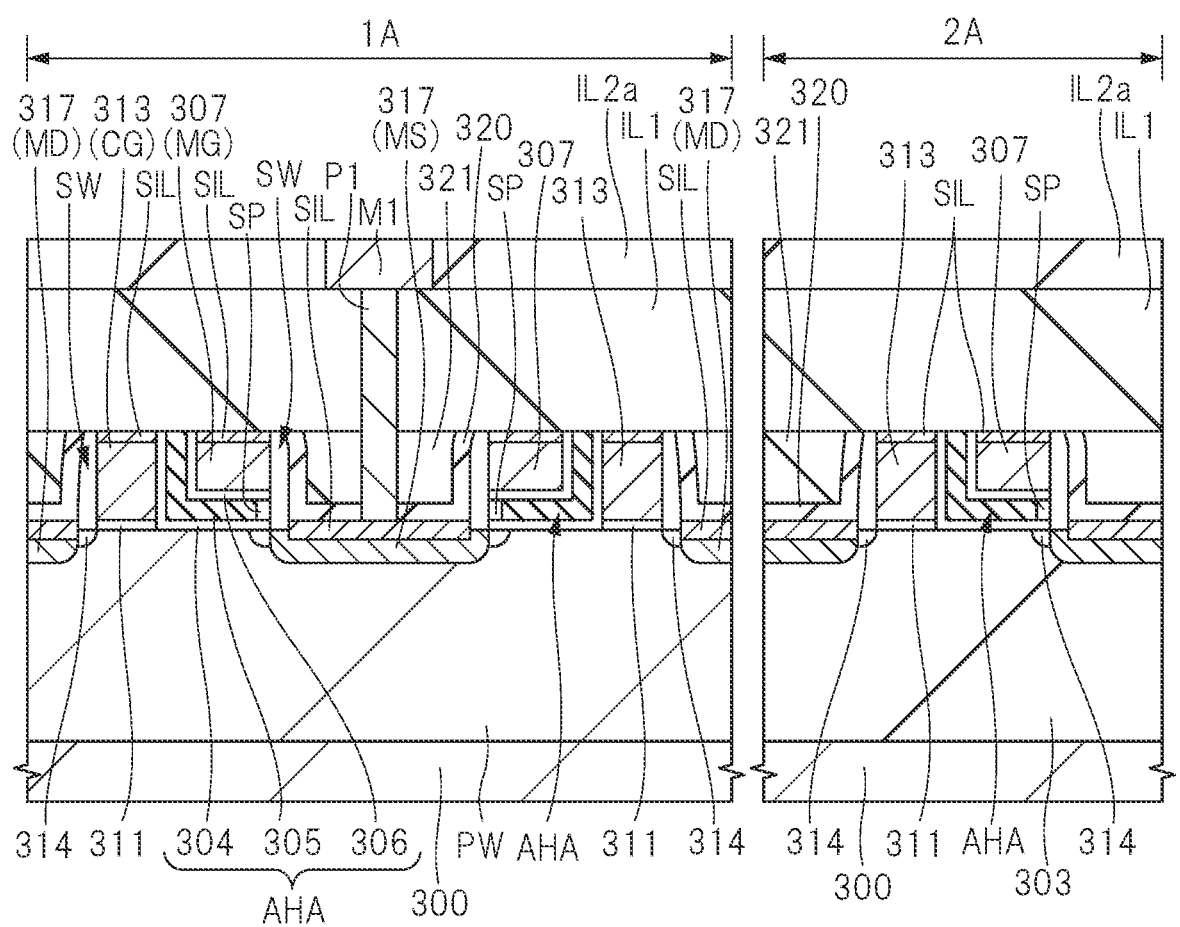
FIG. 38 is a cross-sectional view showing a semiconductor device according to a first application example of a third embodiment.

FIG. 38 is a cross-sectional view showing a semiconductor device according to the present application example. Related reference numerals are given to portions corresponding to the first embodiment, and a detailed description thereof will be omitted.

As shown in FIG. 38, a memory cell (element) includes a control transistor having a control gate electrode portion CG, and a memory transistor having a memory gate electrode portion MG. This memory cell has an insulating film AHA (304, 305, 306) arranged between a memory gate electrode portion (polysilicon film 307) MG and a semiconductor substrate 300 (p-type well PW). The insulating film AHA is composed of, for example, an $Al_2O_3$ film 304, an HfSiO film 305 on the $Al_2O_3$ film 304, and an $Al_2O_3$ film 306 on the HfSiO film 305. Then, the insulating film AHA extends to a position between the control gate electrode portion CG and the memory gate electrode portion MG. According to such a configuration, since the HfSiO film 305 exists between the CG/MG, speed thereof can be improved in the writing of an SSI method.

A laminated sidewall film SW is formed on the side surface of the above-mentioned HfSiO film 305 via the gap SP.

Figure 39:
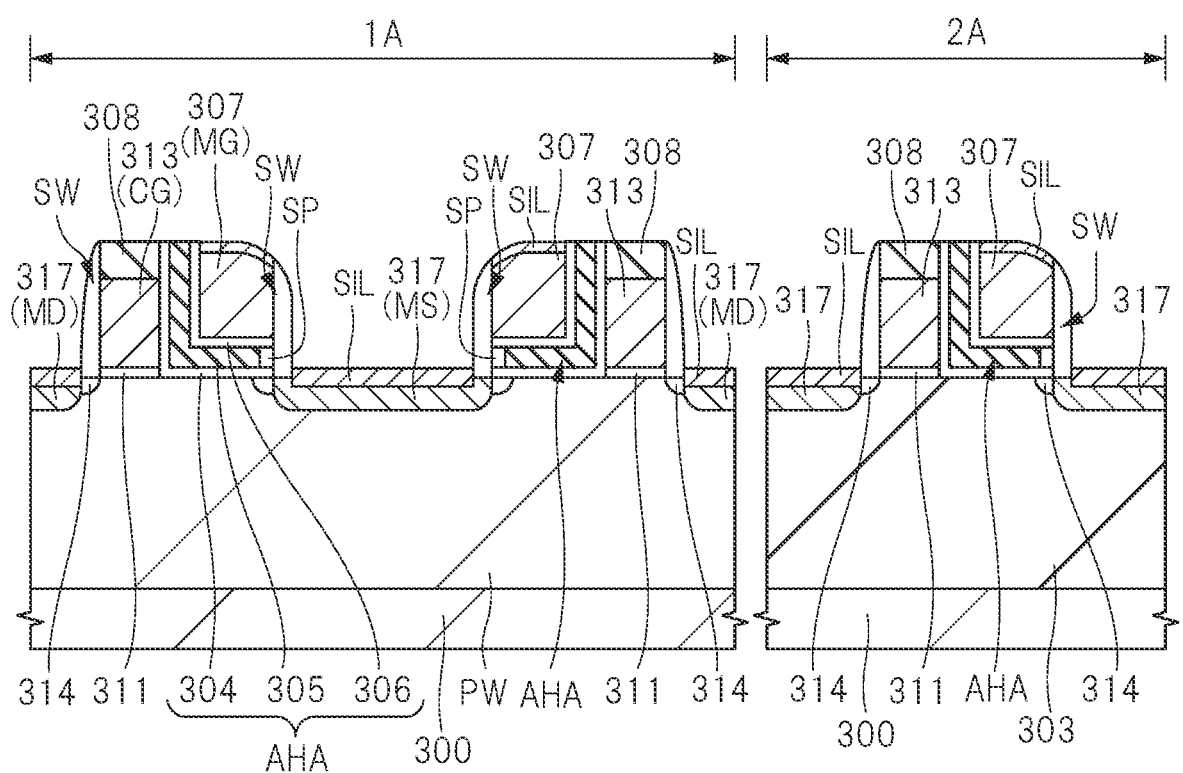
FIG. 39 is a cross-sectional view showing a manufacturing process of the semiconductor device according to the first application example of the third embodiment.

For example, as shown in FIG. 39, after the sidewall-shaped memory gate electrode portion MG is formed on the side surface of the control gate electrode portion CG via the insulating film AHA (304, 305, 306), side etch is performed in the same manner as that in the first embodiment, and a dummy embedded film is embedded. Next, by forming a first sidewall film and removing the dummy embedded film, a space SP can be formed at an end of the L-shaped insulating film AHA (304, 305, 306). FIG. 39 is a cross-sectional view showing a manufacturing process of the semiconductor device according to the present application example.

Second Application Example

Figure 40:
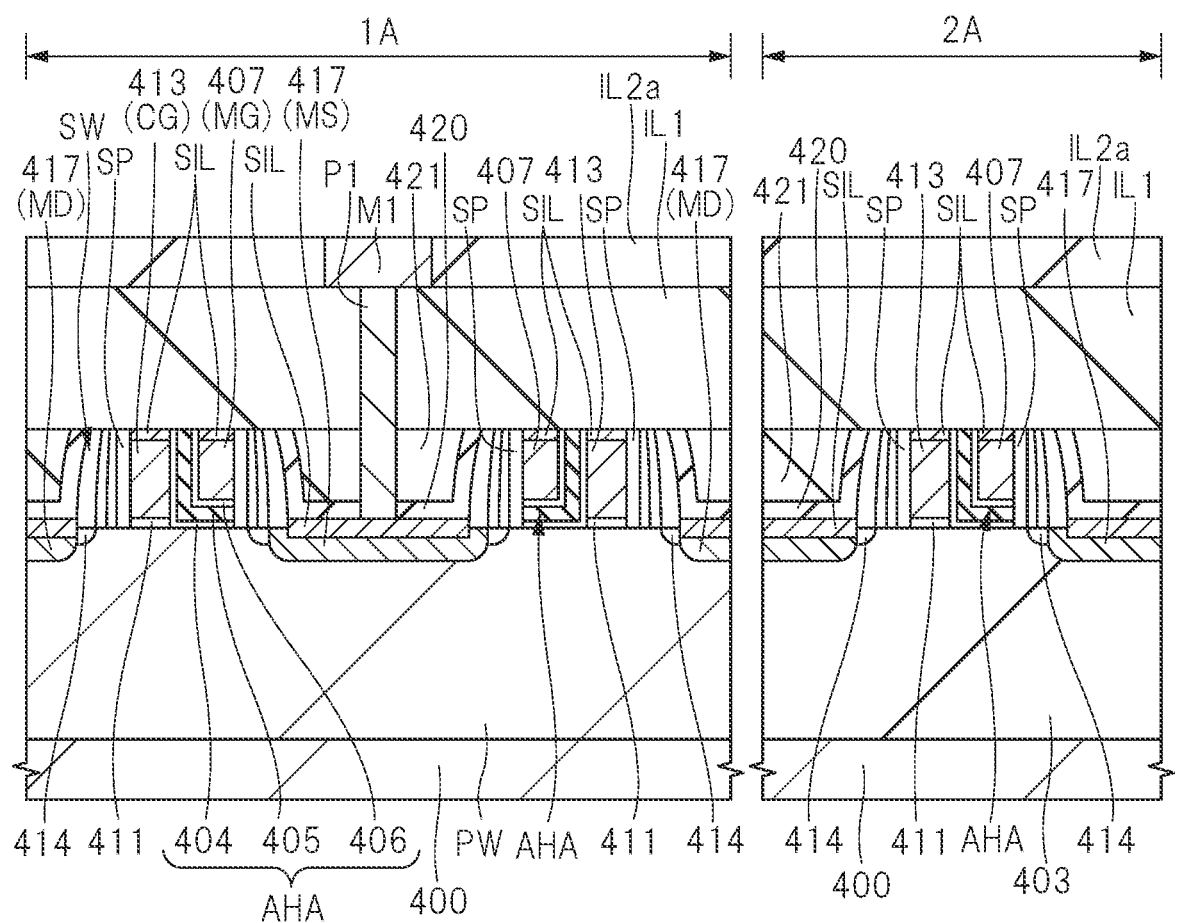
FIG. 40 is a cross-sectional view showing a semiconductor device according to a second application example of the third embodiment.

FIG. 40 is a cross-sectional view showing a semiconductor device according to the present application example. Related reference numerals are given to portions corresponding to the first embodiment, and a detailed description thereof will be omitted.

As shown in FIG. 40, a memory cell (element) includes a control transistor having a control gate electrode portion CG, and a memory transistor having a memory gate electrode portion MG. This memory cell has an insulating film AHA (404, 405, 406) arranged between the memory gate electrode portion (polysilicon film 407) MG and a semiconductor substrate 400 (p-type well PW). The insulating film AHA is composed of, for example, an $A0_2O_3$ film 304, an HfSiO film 405 on the $A0_2O_3$ film 304, and an $Al_2O_3$ film 406 on the HfSiO film 405. Then, the insulating film AHA extends to a position between the control gate electrode portion CG and the memory gate electrode portion MG. According to such a configuration, since the HfSiO film 405 exists between the CG/MG, speed thereof can be improved in the writing of an SSI method.

A laminated sidewall film SW is formed on the side surfaces of the memory gate electrode portion MG and the insulating film AHA via a gap SP.

Figure 41:
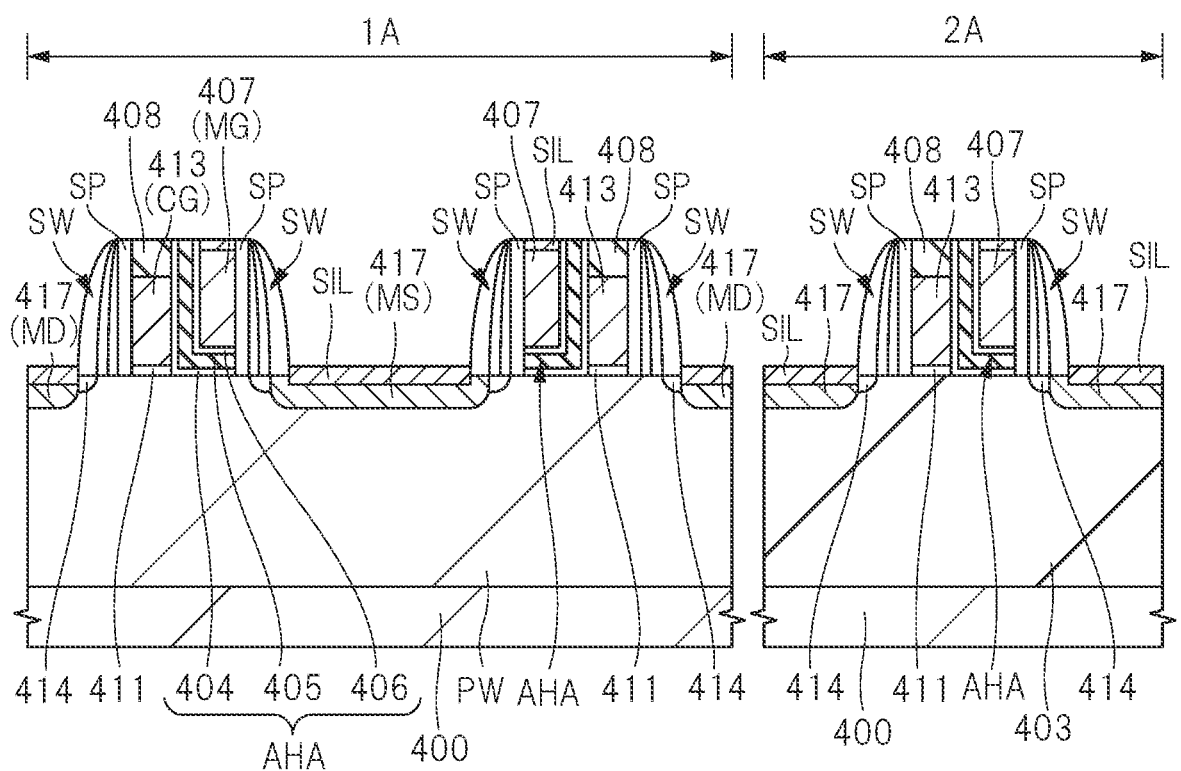
FIG. 41 is a cross-sectional view showing a manufacturing process of the semiconductor device according to the second application example of the third embodiment.

For example, as shown in FIG. 41, after the sidewall-shaped memory gate electrode portion MG is formed on the side surface of the control gate electrode portion CG via the insulating film AHA (404, 405, 406), a spacer film made of a porous silicon oxide film is formed in the same manner as that in the second embodiment. Then, by removing the spacer film after a first sidewall film is further formed, the gap SP can be formed on the side surfaces of the memory gate electrode portion MG and the insulating film AHA. FIG. 40 is a cross-sectional view showing a manufacturing process of the semiconductor device according to the present application example.

As described above, although the invention made by the present inventors has been specifically described based on the embodiments thereof, the present invention is not limited to the above embodiments and, needless to say, can be variously modified without departing from the scope thereof.

What is claimed is:
1. A semiconductor device comprising:
   a semiconductor substrate;
   a first gate electrode portion arranged over the semiconductor substrate;
   a second gate electrode portion arranged over the semiconductor substrate so as to be adjacent to the first gate electrode portion;
   a first insulating film formed between the first gate electrode portion and the semiconductor substrate;
   a second insulating film formed between the second gate electrode portion and the semiconductor substrate and having a charge storage portion therein;
   a first side wall insulating film formed on a side surface of the second gate electrode portion and on a side surface of the second insulting film; and
   a second side wall insulating film between the second gate electrode portion and the first gate electrode portion,
   wherein the second insulating film has a first film, the charge storage portion on the first film, and a second film on the charge storage portion,
   wherein the charge storage portion is made of a high dielectric constant film containing hafnium and oxygen,
   wherein a first air gap is provided between the first film and the second film and between the first side wall insulating film and the charge storage portion without the charge storage portion being in contact with the first side wall insulating film, and
   wherein a second air gap is provided between the first film and the second film between the second side wall insulating film and the charge storage portion without the charge storage portion being in contact with the second side wall insulating film.
2. The semiconductor device according to claim 1, wherein the first film and the second film are aluminum oxide films.

* * * * *